(12) United States Patent
Huang et al.

(10) Patent No.: US 11,742,434 B2
(45) Date of Patent: Aug. 29, 2023

(54) MEMORY DEVICE HAVING RECESSED ACTIVE REGION

(71) Applicant: TAIWAN SEMICONDUCTOR MANUFACTURING CO., LTD., Hsinchu (TW)

(72) Inventors: Yong-Sheng Huang, Taipei (TW); Ming-Chyi Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/092,423

(22) Filed: Jan. 2, 2023

(65) Prior Publication Data

US 2023/0143082 A1 May 11, 2023

Related U.S. Application Data

(60) Continuation of application No. 17/230,906, filed on Apr. 14, 2021, now Pat. No. 11,545,584, which is a division of application No. 16/734,095, filed on Jan. 3, 2020, now Pat. No. 10,998,450.

(51) Int. Cl.
| | |
|---|---|
| *H01L 29/792* | (2006.01) |
| *H01L 29/06* | (2006.01) |
| *H01L 29/423* | (2006.01) |
| *H01L 29/66* | (2006.01) |
| *H01L 21/28* | (2006.01) |
| *H01L 21/762* | (2006.01) |

(52) U.S. Cl.
CPC .... *H01L 29/7926* (2013.01); *H01L 21/76224* (2013.01); *H01L 29/0653* (2013.01); *H01L 29/40114* (2019.08); *H01L 29/42344* (2013.01); *H01L 29/66666* (2013.01); *H01L 29/66833* (2013.01)

(58) Field of Classification Search
CPC .......... H01L 29/7926; H01L 29/40114; H01L 21/76224
See application file for complete search history.

(56) References Cited

U.S. PATENT DOCUMENTS

| | | |
|---|---|---|
| 9,853,039 B1 | 12/2017 | Kang et al. |
| 2013/0207174 A1 | 8/2013 | Wang et al. |
| 2015/0263010 A1 | 9/2015 | Chuang et al. |
| 2016/0020219 A1 | 1/2016 | Chuang et al. |
| 2017/0084622 A1 | 3/2017 | Hsu et al. |
| 2018/0315846 A1 | 11/2018 | Bobde et al. |
| 2019/0198665 A1 | 6/2019 | Bian |

*Primary Examiner* — Errol V Fernandes
(74) *Attorney, Agent, or Firm* — Maschoff Brennan

(57) ABSTRACT

A device includes an active region, a select gate, a control gate, a first metal alloy layer, and a second metal alloy layer. The active region has a source region and a drain region. The select gate is over the active region and between the source region and the drain region. The control gate is over the active region and between the source region and the select gate. The first metal alloy layer is in contact with the source region. The second metal alloy layer is in contact with the drain region and higher than a top surface of the control gate.

20 Claims, 41 Drawing Sheets

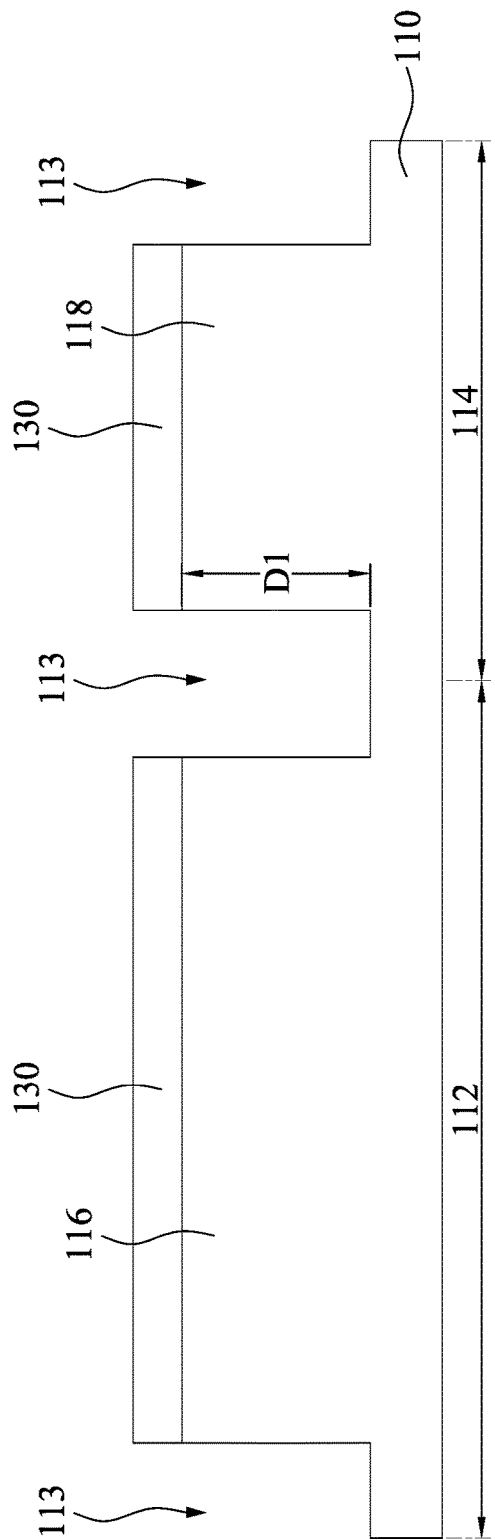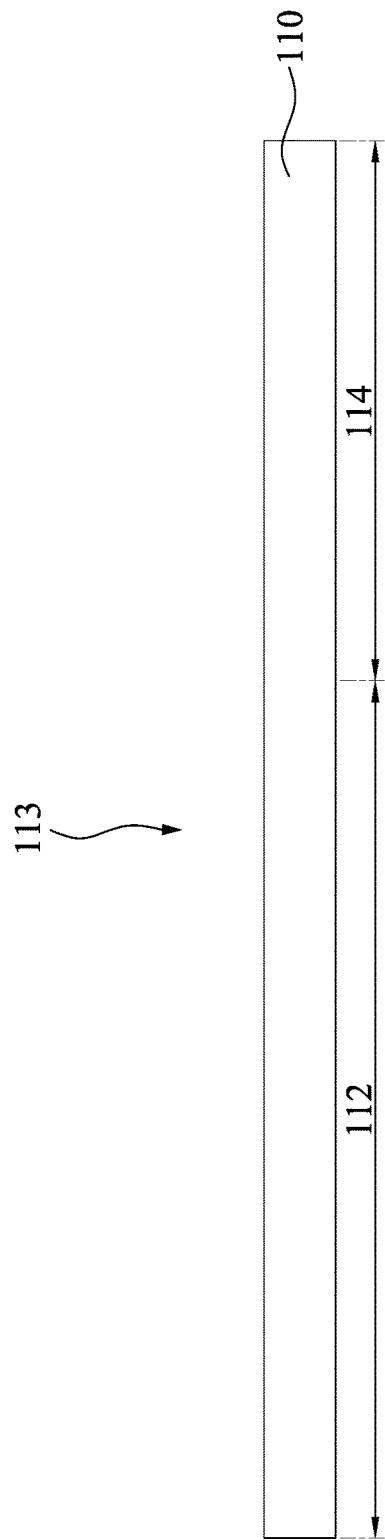

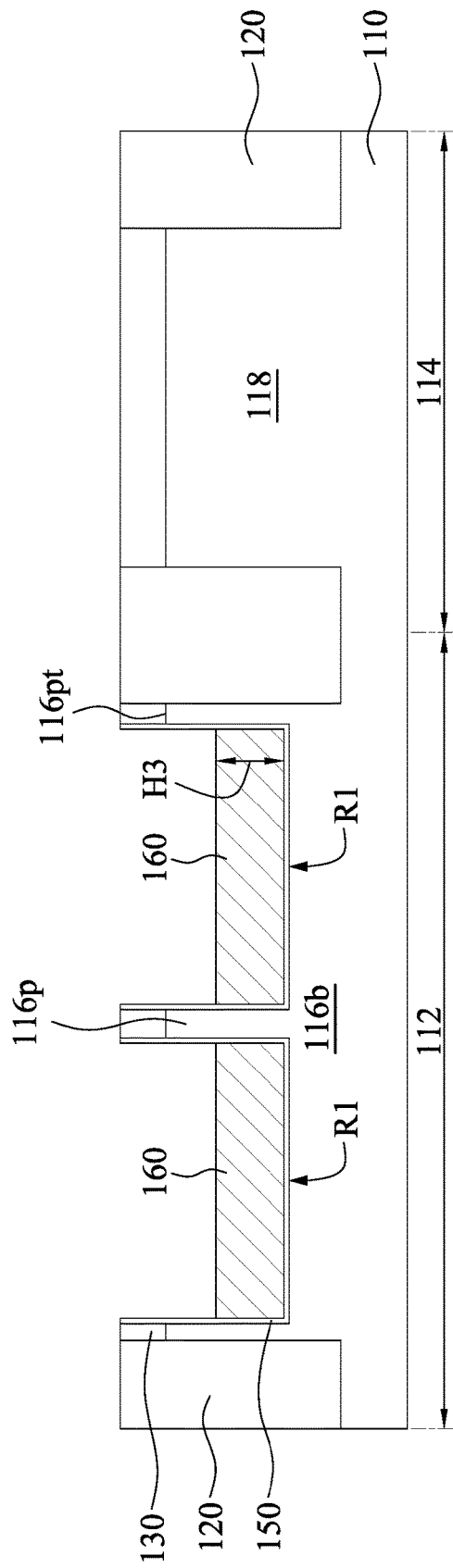
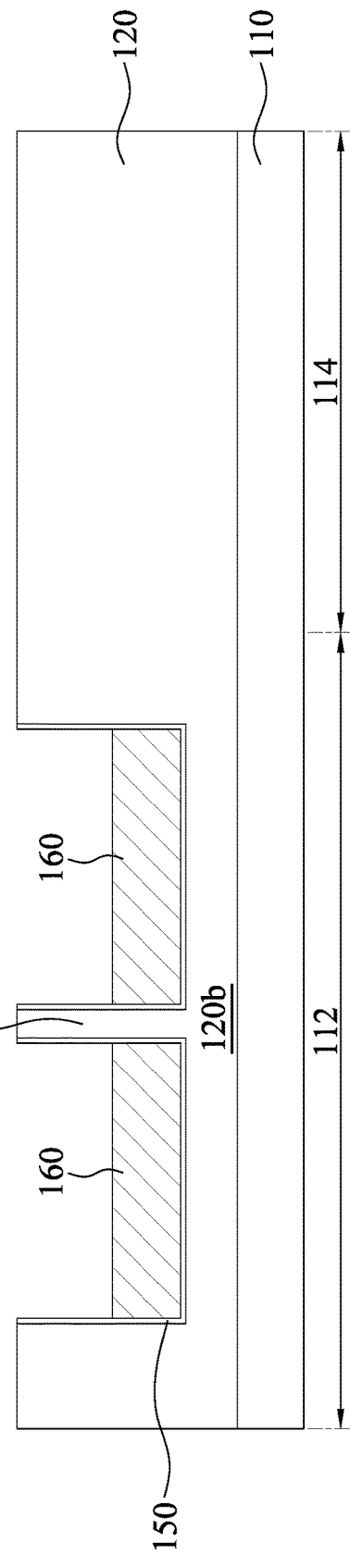
Fig. 8B
Fig. 8C

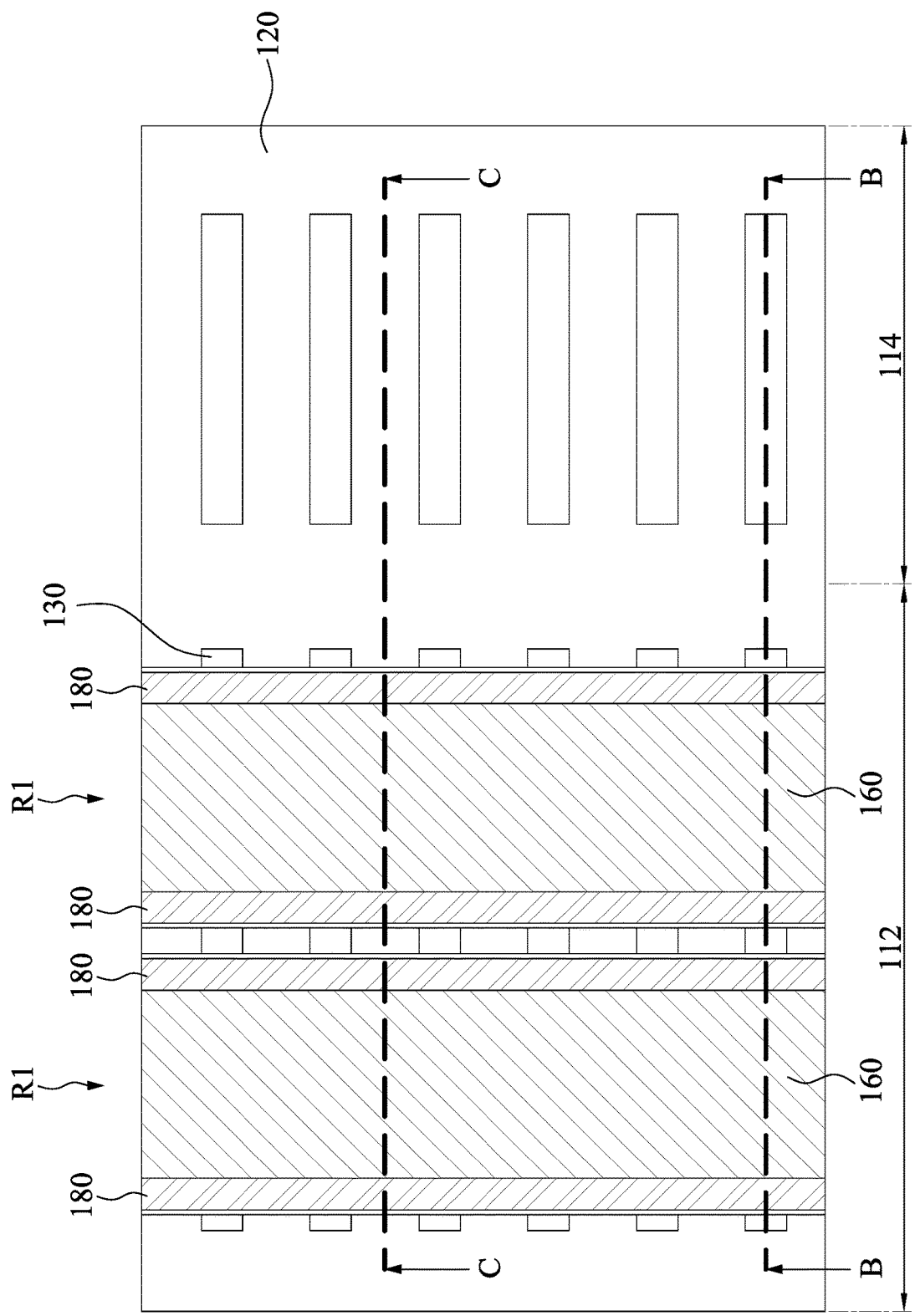

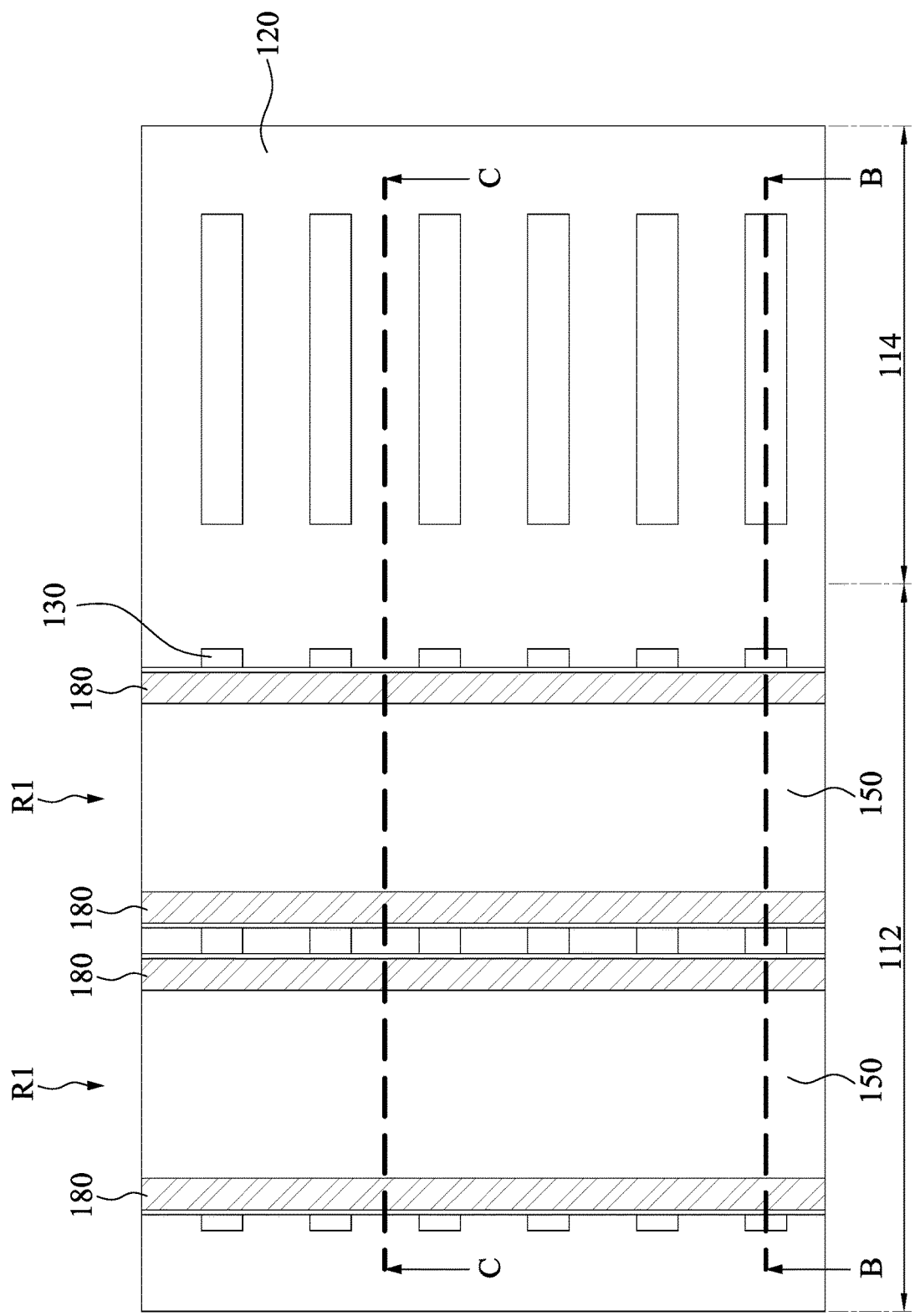

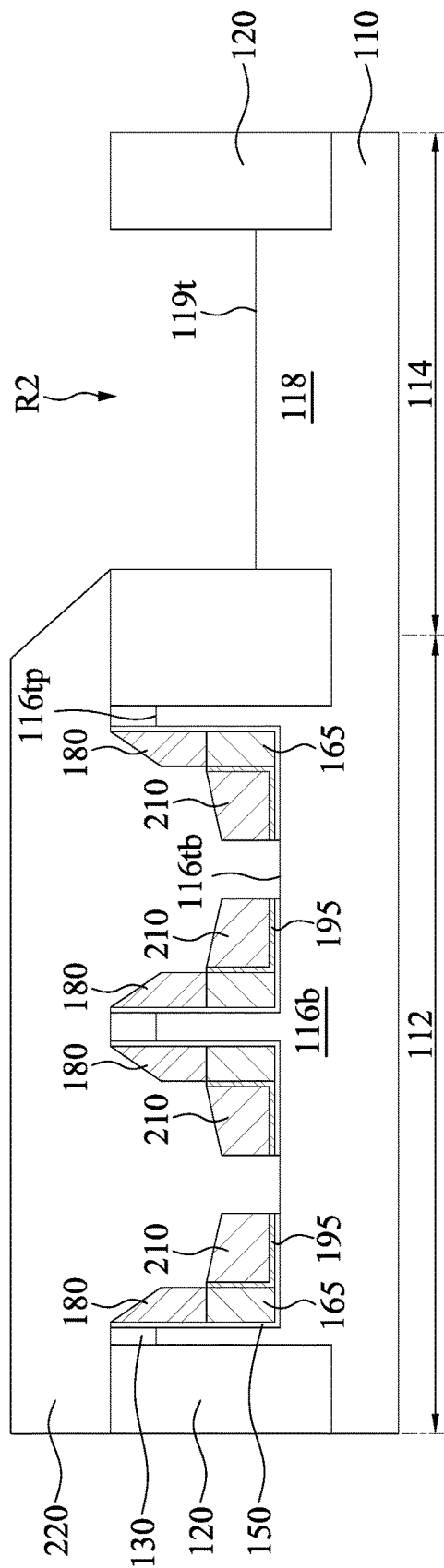
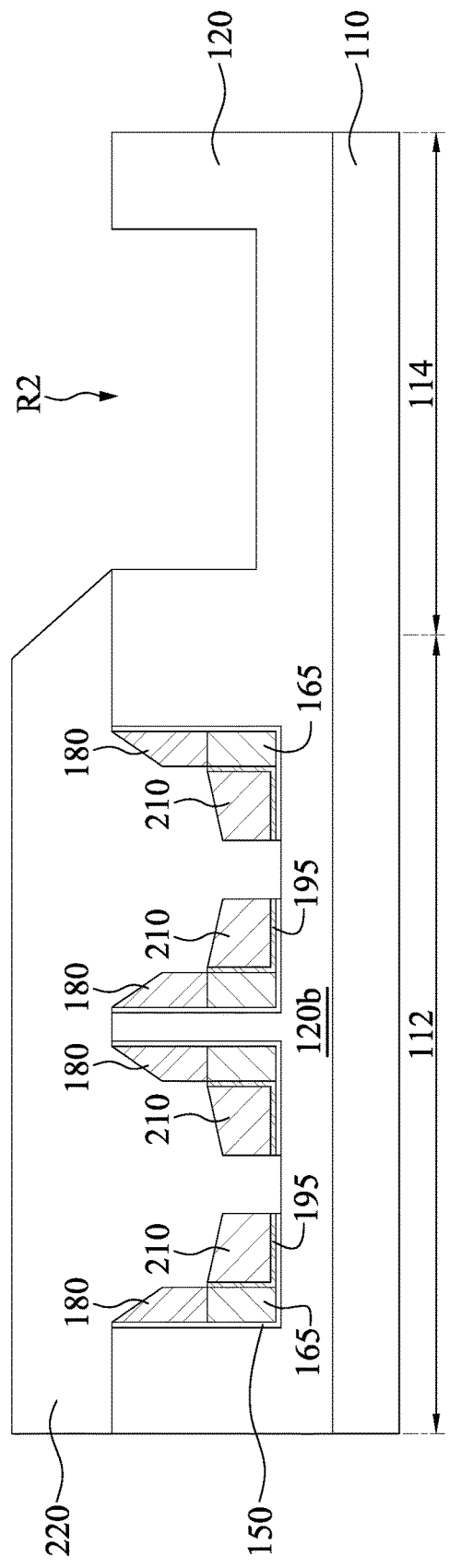
Fig. 15B
Fig. 15C

MEMORY DEVICE HAVING RECESSED ACTIVE REGION

RELATED APPLICATIONS

This application is a continuation application of U.S. patent application Ser. No. 17/230,906, filed Apr. 14, 2021, now U.S. Pat. No. 11,545,584, issued Jan. 3, 2023, which is a divisional application of U.S. patent application Ser. No. 16/734,095, filed Jan. 3, 2020, now U.S. Pat. No. 10,998,450, issued May 4, 2021, which is herein incorporated by reference in their entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
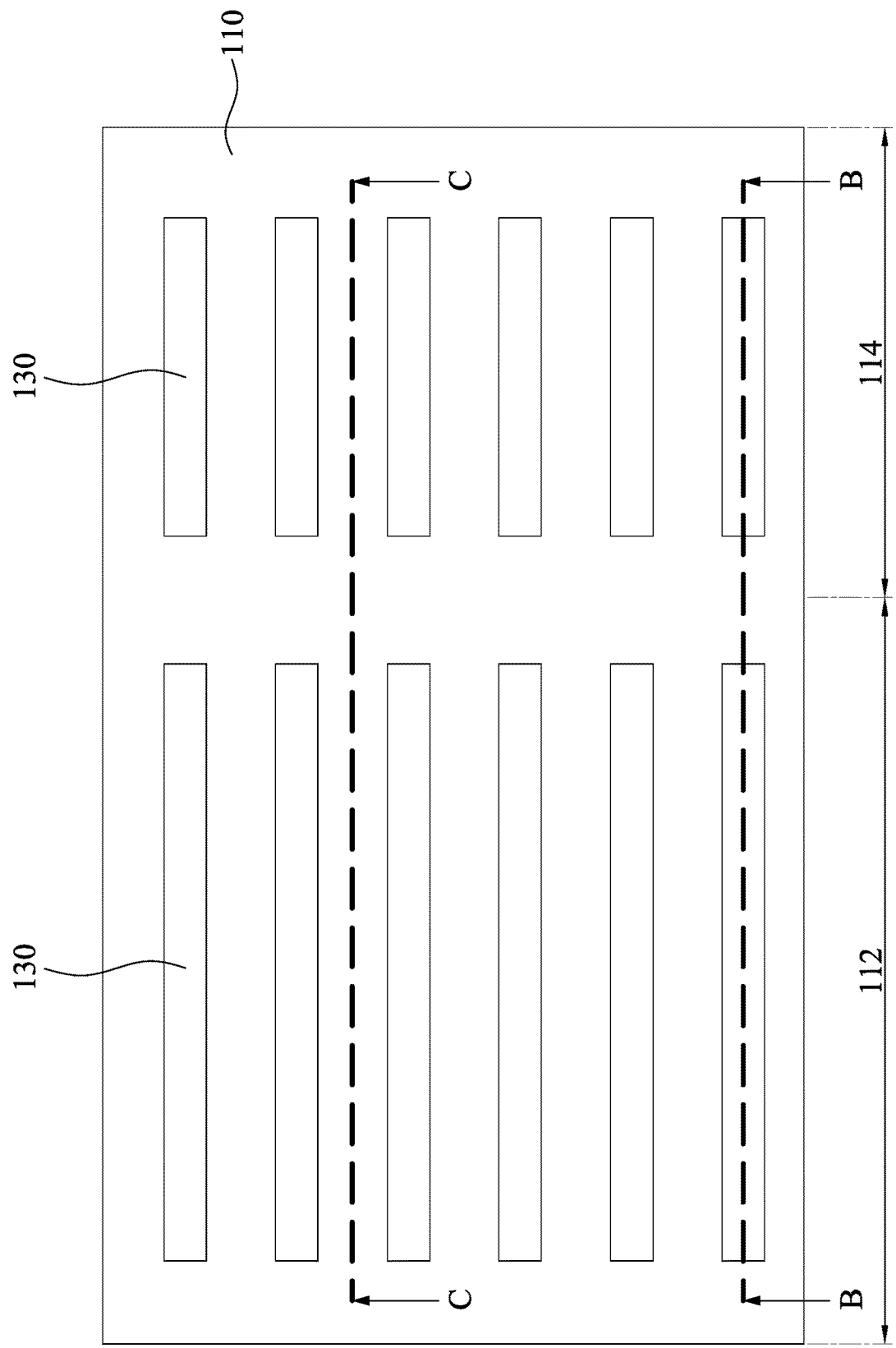
FIGS. 1A to 19C illustrate a method for manufacturing a memory device in different stages in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

Some embodiments of the present disclosure relate to metal-oxide-nitride-oxide-silicon (MONOS) memory devices having protruding drains. Although some implementations are illustrated below with regards to MONOS memory, it will be appreciated that this concept is not limited to MONOS memory cells, but is also applicable to other types of flash memory cells as well as to other types of semiconductor devices, such as MOSFETs, FinFETs, and the like.

Figure 1B:
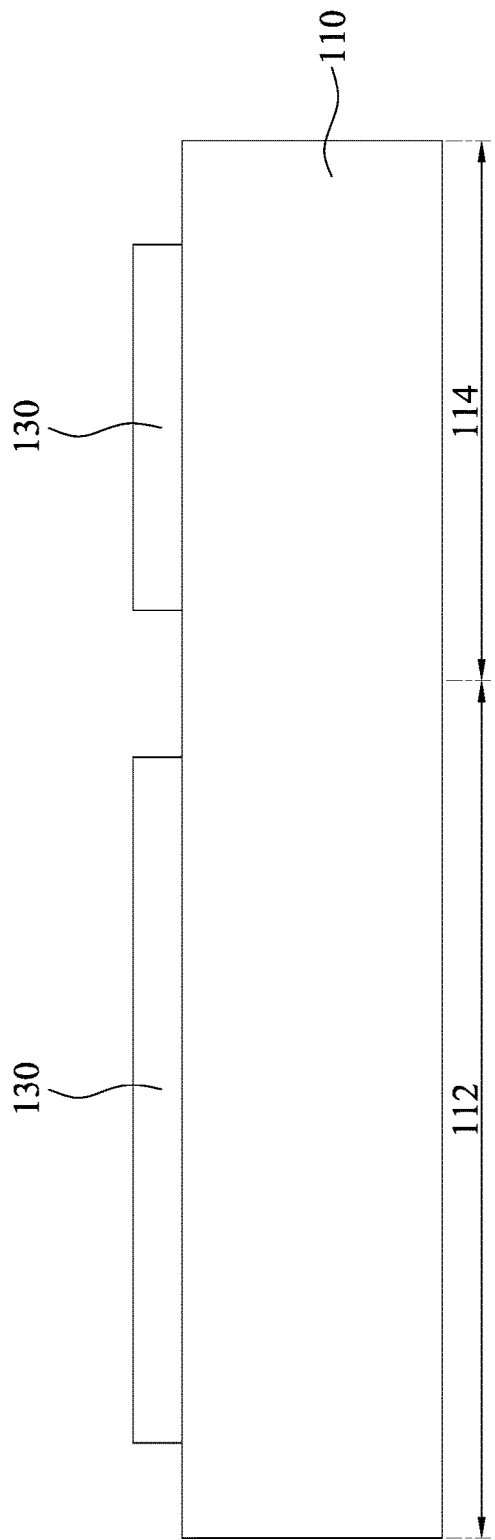
Figure 1C:
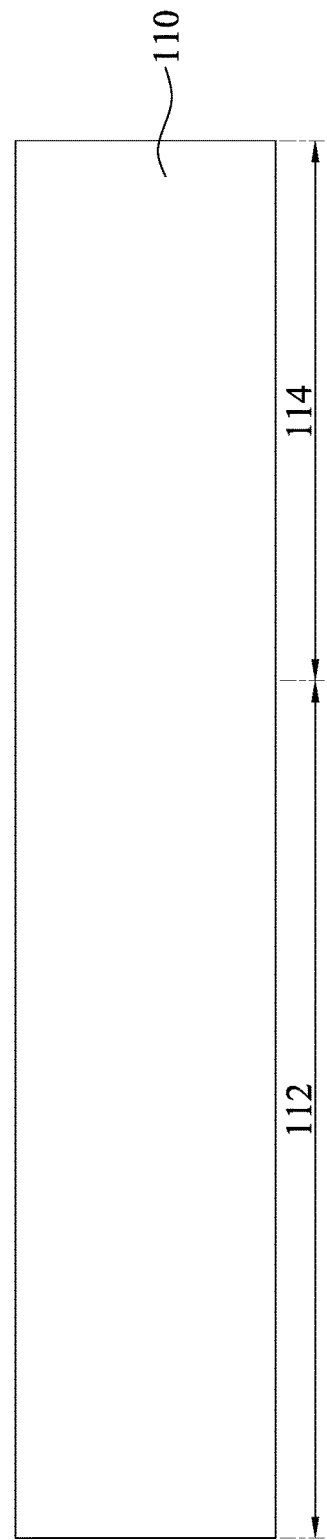

FIGS. 1A to 19C illustrate a method for manufacturing a memory device in different stages in accordance with some embodiments. Reference is made to FIGS. 1A-1C, where FIG. 1A is a top view of the memory device according with some embodiments, FIG. 1B is a cross-sectional view taking along line B-B of FIG. 1A, and FIG. 1C is a cross-sectional view taking along line C-C of FIG. 1A. A substrate 110 is provided. In some embodiments, the substrate 110 can be a semiconductor substrate, such as a bulk silicon substrate, a germanium substrate, a compound semiconductor substrate, or other suitable substrate. The substrate 110 may include an epitaxial layer overlying a bulk semiconductor, a silicon germanium layer overlying a bulk silicon, a silicon layer overlying a bulk silicon germanium, or a semiconductor-on-insulator (SOI) structure. The substrate 110 includes a cell region 112 and a peripheral region 114. The peripheral region 114 is located at least one edge of the cell region 112. For example, the peripheral region 114 surrounds the cell region 112. A patterned mask layer 130 is formed over the substrate 110. In some embodiments, the patterned mask layer 130 is formed of dielectric material, such as silicon nitride (SiN) or other suitable materials. In some embodiments, a pad layer is formed between the substrate 110 and the patterned mask layer 130. The pad layer may be formed of dielectric material, such as an oxide layer.

In some embodiments, a blanket mask layer may be formed on the substrate 110, and the blanket mask layer (and the pad layer) is patterned to form the patterned mask layer 130. Specifically, portions of the blanket mask layer are removed to expose the substrate 110. In some embodiments, a patterned photoresist may be formed over the blanket mask layer, and an etching process is performed to form the patterned mask layer 130.

Figure 2A:
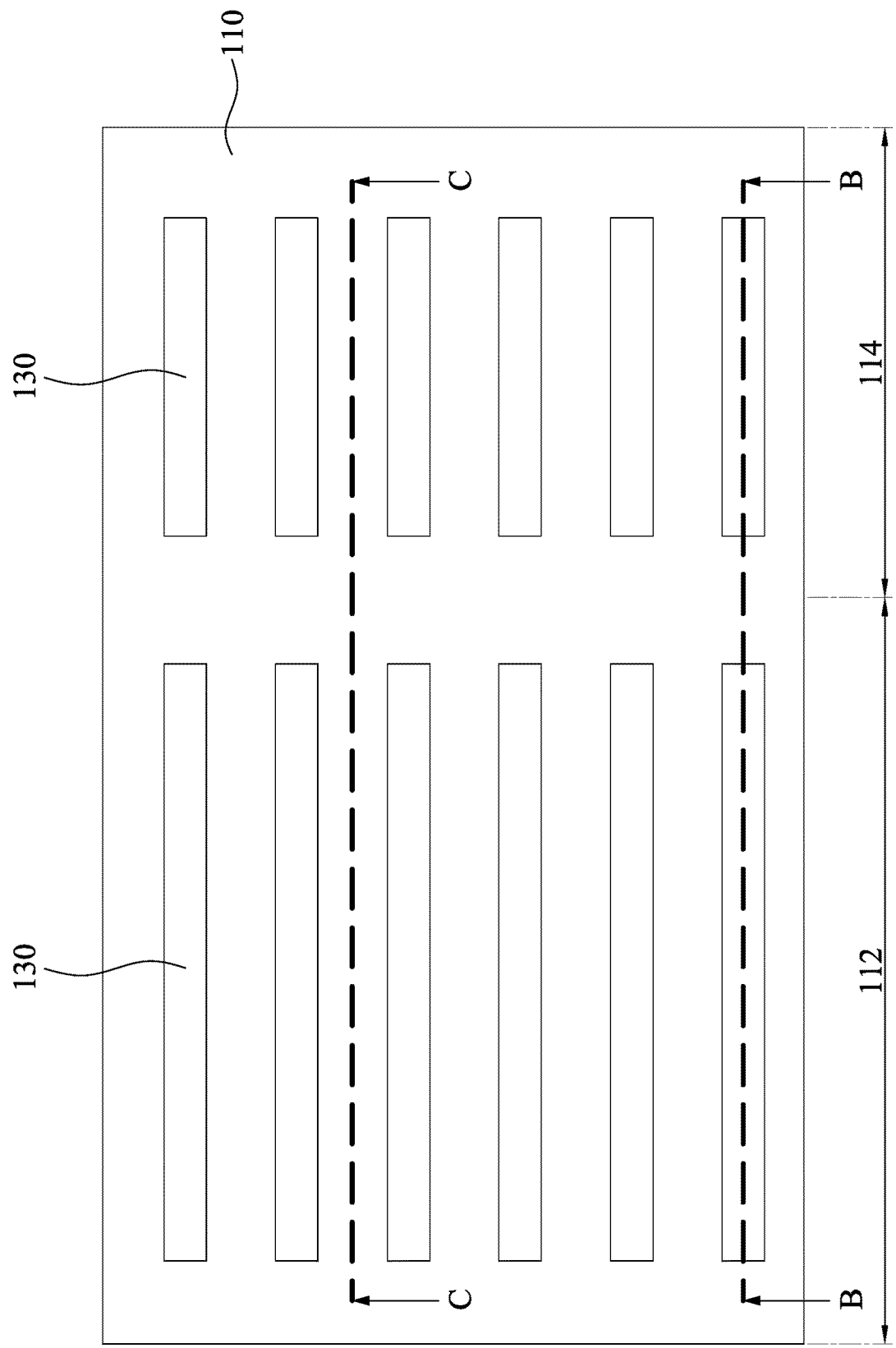

Reference is made to FIGS. 2A-2C, where FIG. 2A is a top view of the memory device according with some embodiments, FIG. 2B is a cross-sectional view taking along line B-B of FIG. 2A, and FIG. 2C is a cross-sectional view taking along line C-C of FIG. 2A. Trench(es) 113 is/are formed in the substrate 110. Specifically, the trench(es) 113 is/are formed by performing a dry etch to remove the exposed portions of the substrate 110. The trenches 113 define active regions 116 and 118 therebetween. The active regions 116 are over the cell region 112 of the substrate 110, and the active regions 118 are over the peripheral region 114 of the substrate 110. In some embodiments, the trench 113 has a depth D1 in a range of about 200 nm to about 350 nm.

Figure 3A:
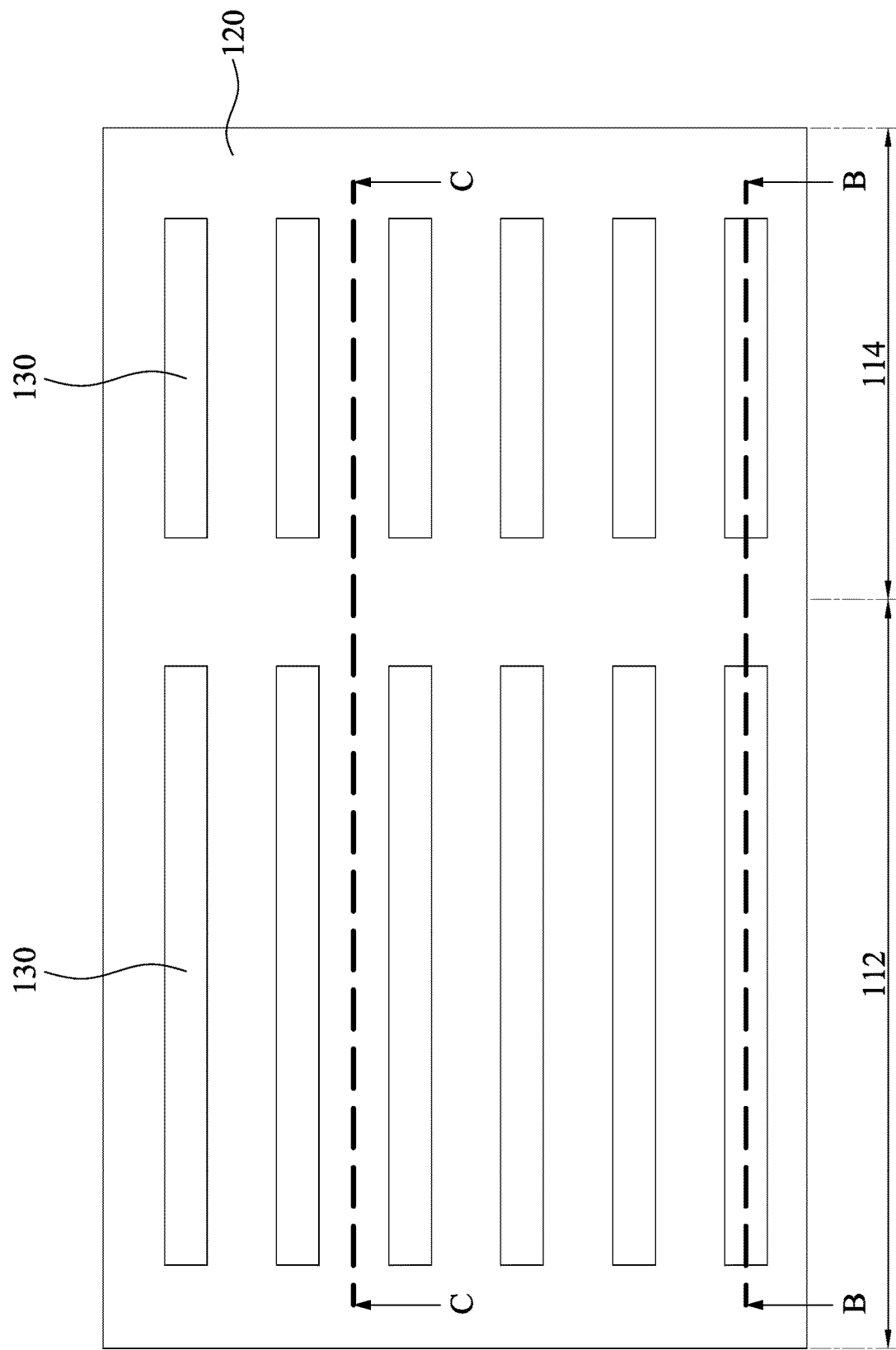
Figure 3B:
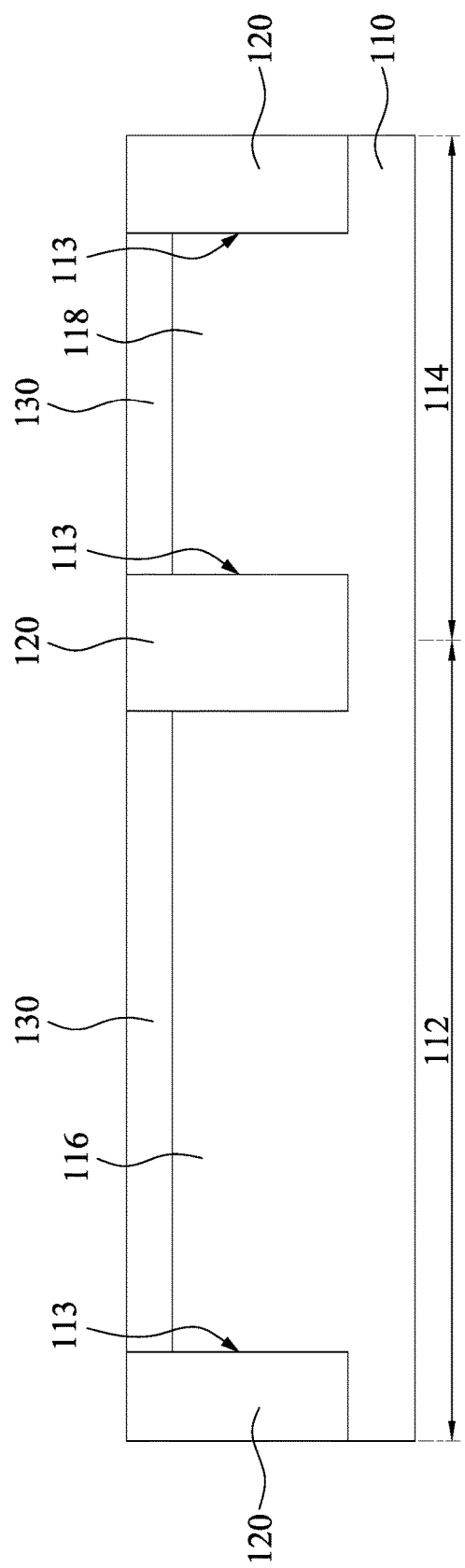
Figure 3C:
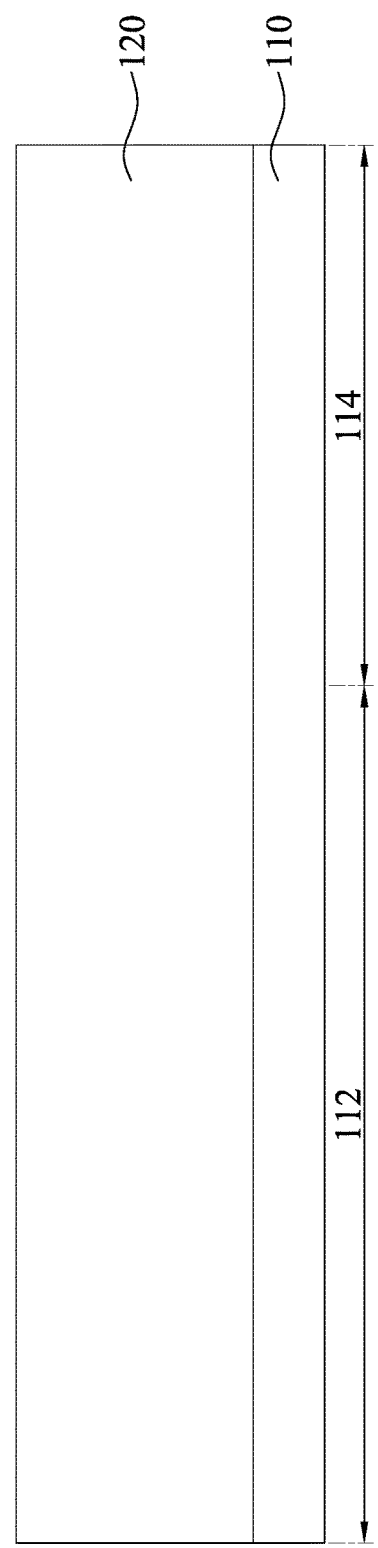

Reference is made to FIGS. 3A-3C, where FIG. 3A is a top view of the memory device according with some embodiments, FIG. 3B is a cross-sectional view taking along line B-B of FIG. 3A, and FIG. 3C is a cross-sectional view taking along line C-C of FIG. 3A. A (plurality of) isolation feature(s) 120 are respectively formed in the trenches 113 of FIGS. 2A-2C. It is noted that the number of the isolation feature 120 can be plural in some other embodiments. In greater detail, dielectric material covers the structure of FIG. 2A. In some embodiments, the dielectric material includes oxide and/or other dielectric materials. Optionally, a liner oxide (not shown) may be formed in advance. In some embodiments, the liner oxide may be a thermal oxide. In some other embodiments, the liner oxide may be formed using in-situ steam generation (ISSG). In yet some other embodiments, the liner oxide may be formed using selective area chemical vapor deposition (SACVD) or other commonly used CVD methods. The formation of the liner oxide reduces the electrical fields and hence improves the performance of the resulting semiconductor device. A chemical mechanical polish (CMP) is then performed to level the top surface of the dielectric material to the mask layer 130 to form a plurality of isolation features 120 in the trenches 113 of FIG. 2A.

Figure 4A:
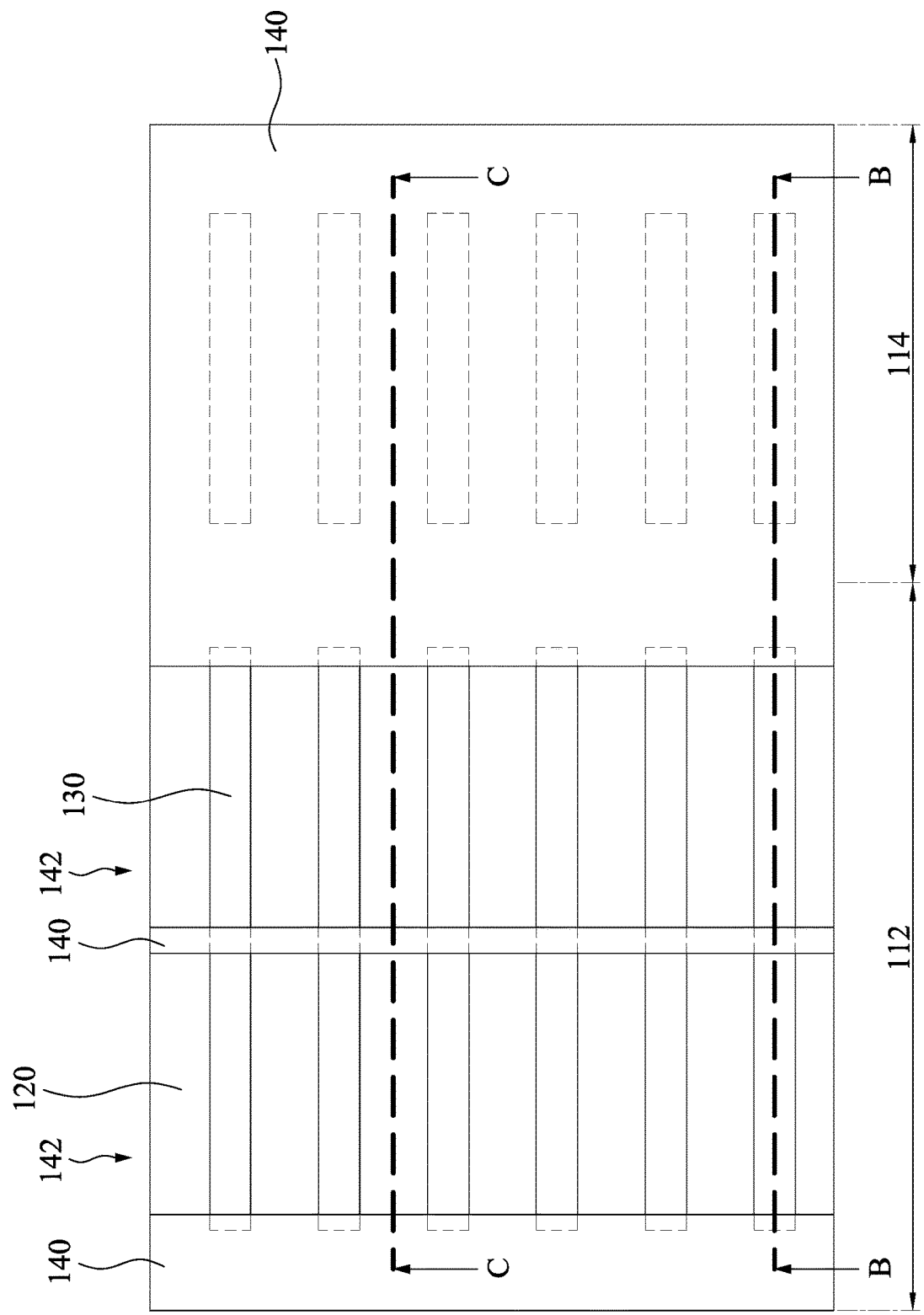
Figure 4B:
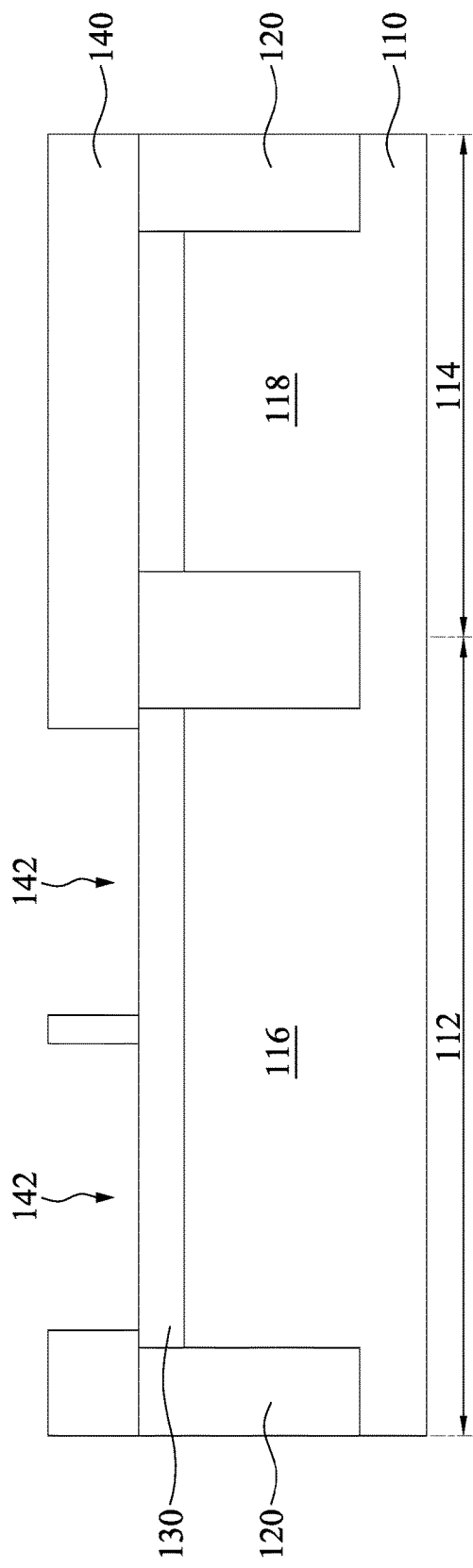
Figure 4C:
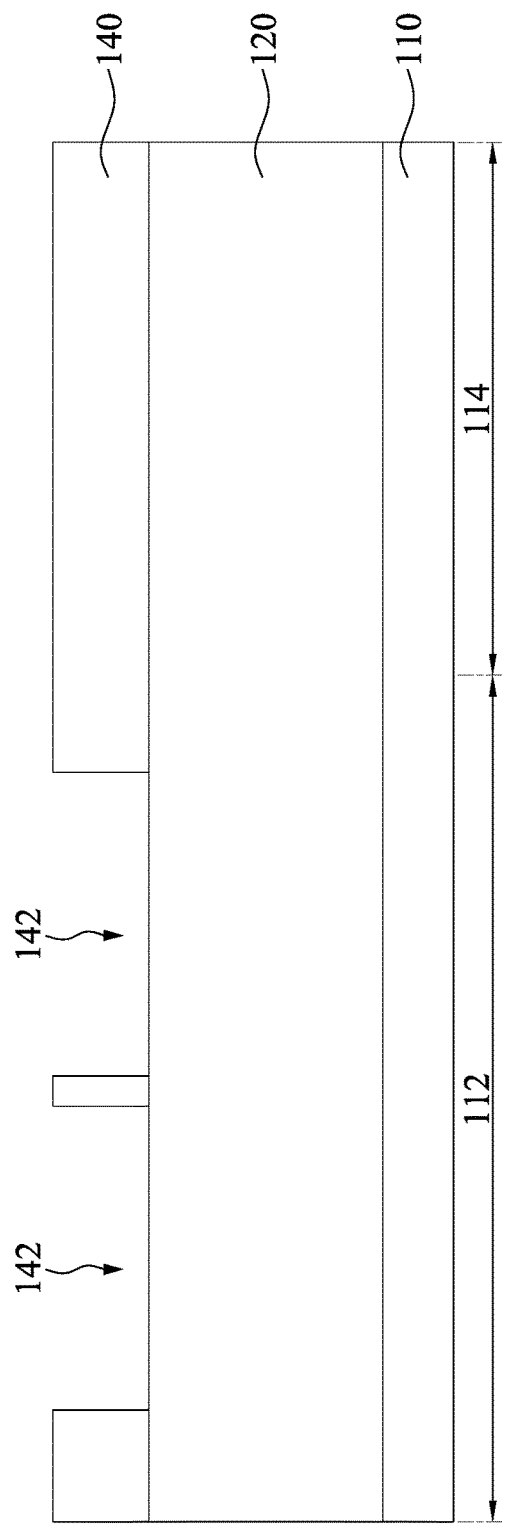

Reference is made to FIGS. 4A-4C, where FIG. 4A is a top view of the memory device according with some embodiments, FIG. 4B is a cross-sectional view taking along line B-B of FIG. 4A, and FIG. 4C is a cross-sectional view taking along line C-C of FIG. 4A. A patterned photoresist 140 is formed over the patterned mask layer 130 and the isolation features 120. The patterned photoresist 140 covers the peripheral region 114. The photoresist 140 further has a plurality of openings 142 exposing portions of the isolation features 120 and the mask layer 130 over the cell region 112. In some embodiments, the openings 142 extend in a first direction, and the active regions 116 extend in a second direction different from the first direction. For example, the first direction and the second direction are substantially perpendicular to each other.

Figure 5A:
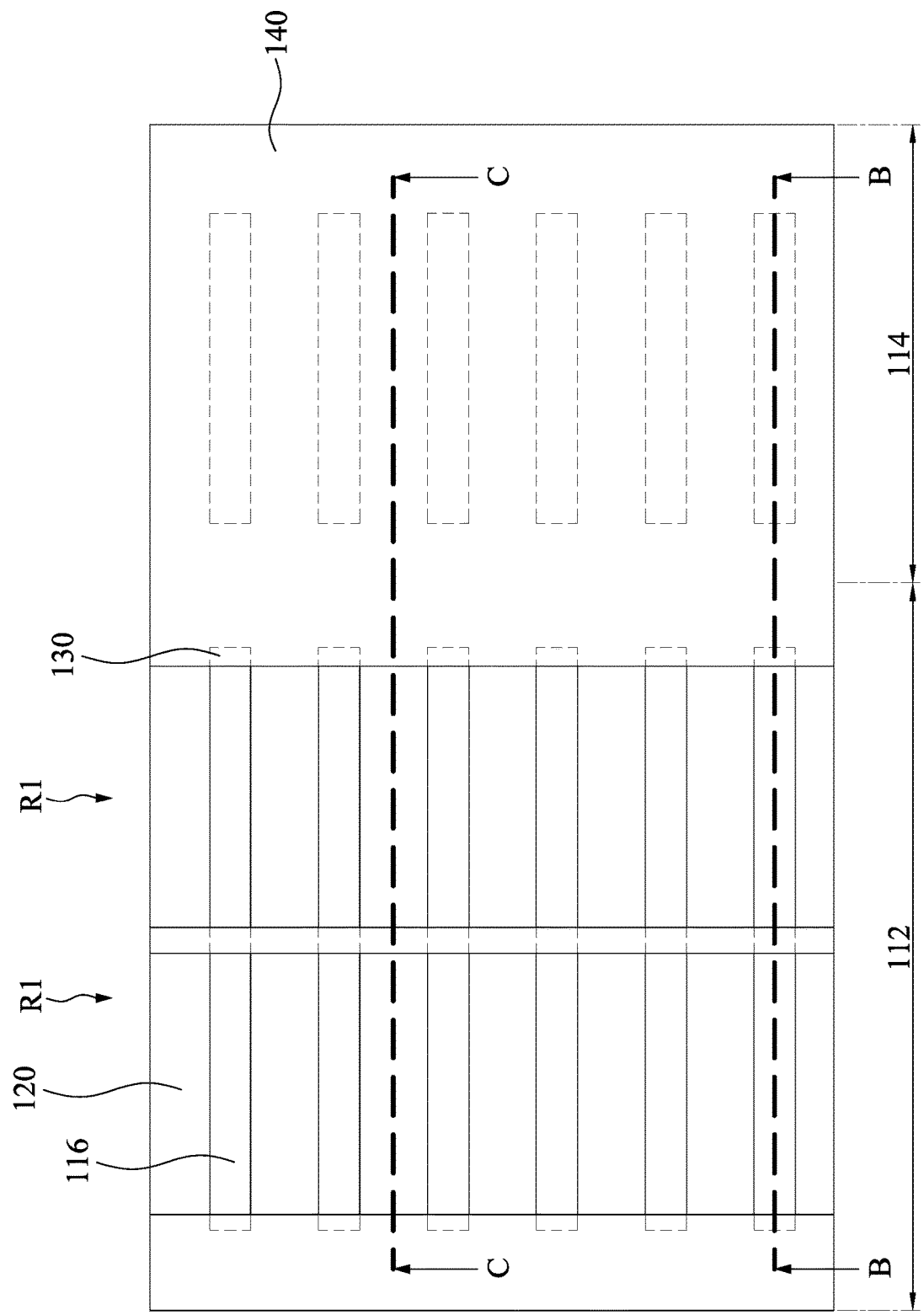
Figure 5B:
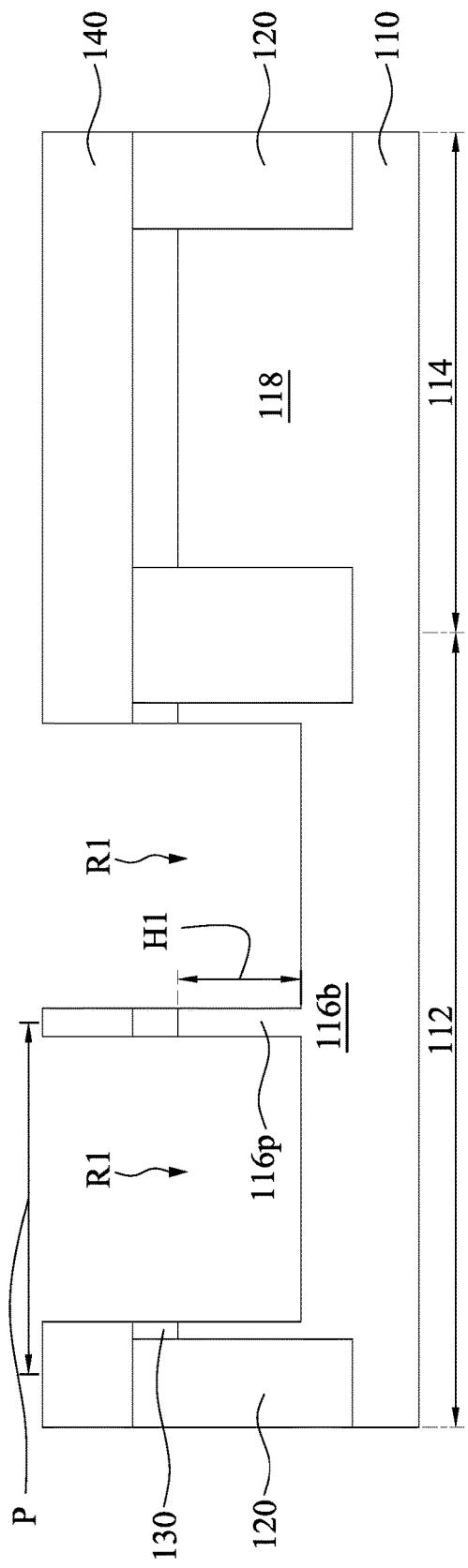
Figure 5C:
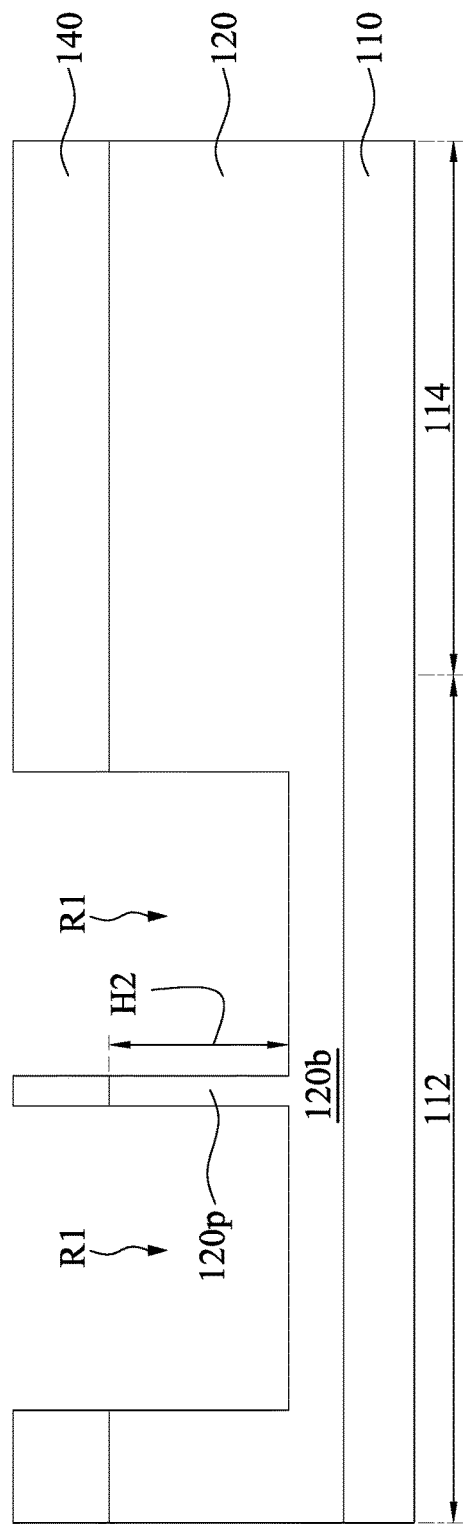

Reference is made to FIGS. 5A-5C, where FIG. 5A is a top view of the memory device according with some embodiments, FIG. 5B is a cross-sectional view taking along line B-B of FIG. 5A, and FIG. 5C is a cross-sectional view taking along line C-C of FIG. 5A. A plurality of recesses R1 are formed in the cell region 112 of the substrate 110. Specifically, the portions of the isolation features 120 and the mask layer 130 exposed by the photoresist 140 are etched to form the recesses R1. In some embodiments, the etching process may be a non-selectivity etching back process, and the etchants may be $Cl_2/CH_2F_2/O_2$, such that the patterned mask layer 130, the active regions 116, and the isolation features 120 are etched in this process. It is noted that the number of the recesses R1 in FIG. 5A is illustrative, and should not limit the present disclosure. The number of the recesses R1 may be greater than two in some other embodiments.

In FIG. 5B, each of the active regions 116 has at least one bottom portion 116b and at least one protruding portion 116p. The protruding portion 116p protrudes from the bottom portion 116b and is covered by the mask layer 130. The bottom portion 116b is exposed by the recesses R1. In the resulting memory device, sources are formed in the bottom portion 116b and drains are formed in the protruding portion 116p. That is, the sources and the drains are at different levels. The detailed structure of the memory device will be described in FIGS. 19A-19C.

Further, in FIG. 5C, each of the isolation features 120 has at least one bottom portion 120b and at least one protruding portion 120p. The protruding portion 120p is covered by the photoresist 140, and the bottom portion 120b is exposed by the recesses R1. The protruding portions 120p of the isolation features 120 are in contact with the protruding portions 116p of the active regions 116, and the bottom portions 120b of the isolation features 120 are in contact with the bottom portions 116b of the active regions 116. In the resulting memory device, sources are formed between the adjacent bottom portions 120b and drains are formed between the adjacent protruding portions 120p.

In some embodiments, the protruding portion 116p has a height H1 less than the depth D1 of the trench (FIG. 2B), such that the adjacent remaining active regions 116 are still separated by the isolation features 120. In some embodiments, the height H1 of the protruding portion 116p may be in a range of about 40 nm to about 80 nm. If the height H1 is less than about 40 nm, the cell density is not increased enough; if the height H1 is greater than about 80 nm, the recesses R1 may have high aspect ratio, which may increase the manufacturing difficulty in the following process. In some embodiments, the pitch P of the protruding portions 116p (i.e., the width of the recess R1) is in a range of about 420 nm to about 500 nm, which depends on the height H1 of the protruding portion 116p. The channel length of the resulting memory cell is H1+P/2. Since the height H1 is greater than 0, the lateral distance between the source and drain (i.e., P/2) is decreased compared with a planar memory cell. Hence, the resulting memory device of various embodiments has a dense layout. In FIGS. 5B and 5C, the protruding portion 120p has a height H2 greater than the height H1 of the protruding portion 116p. The difference between the heights H1 and H2 is substantially the thickness of the patterned mask layer 130.

Figure 6A:
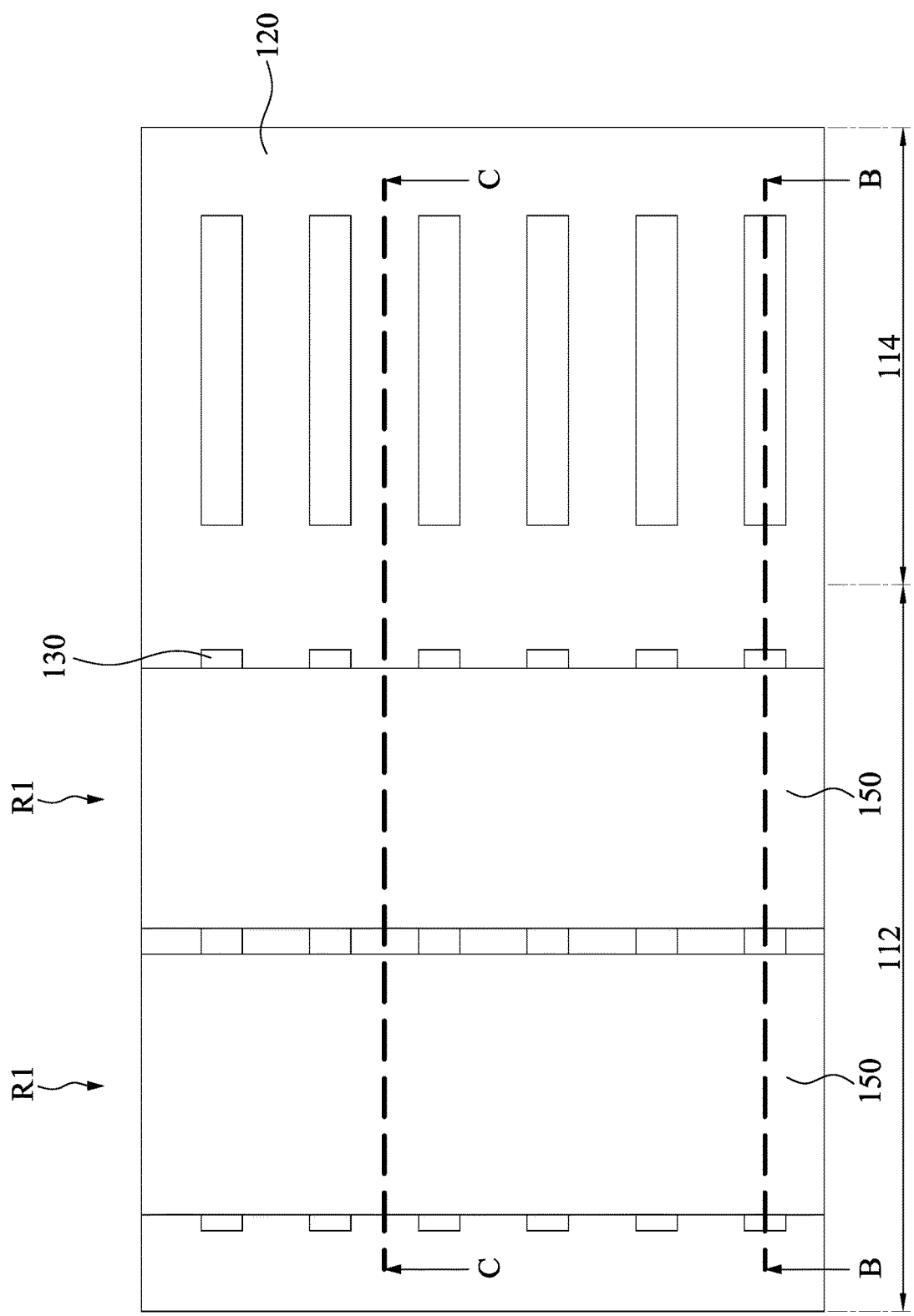
Figure 6B:
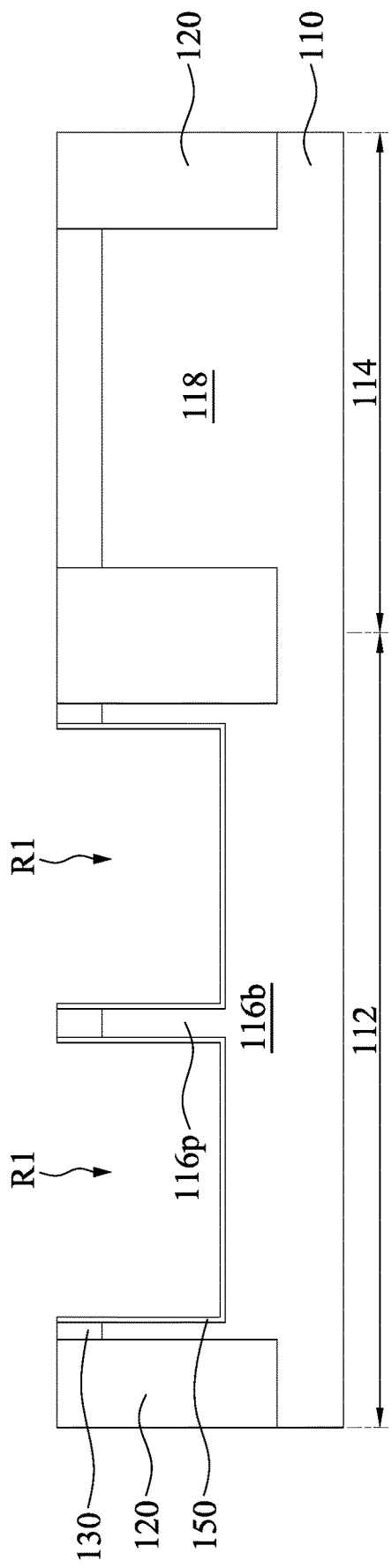
Figure 6C:
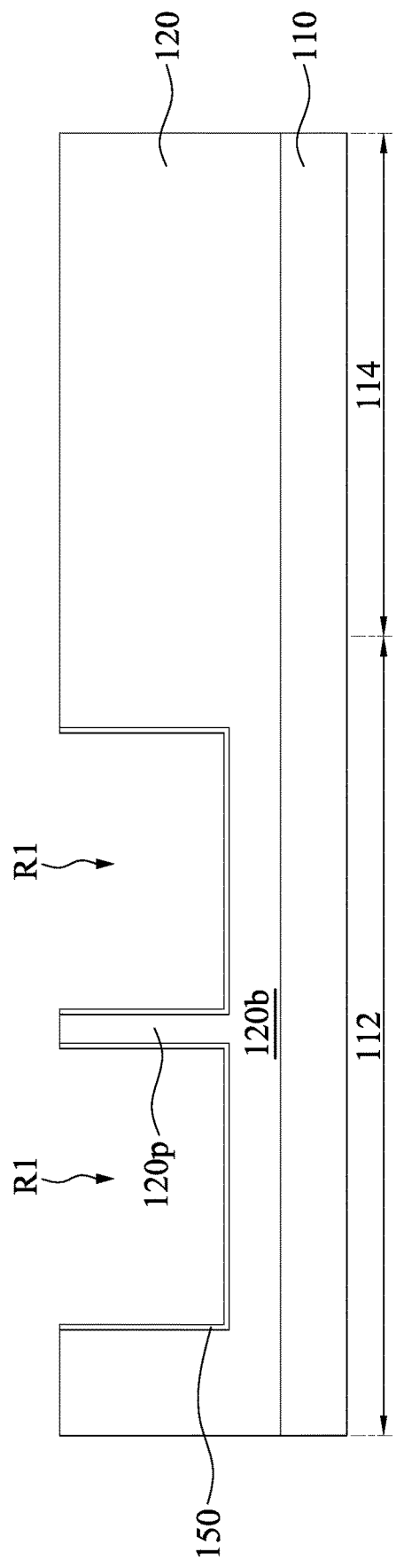

Reference is made to FIGS. 6A-6C, where FIG. 6A is a top view of the memory device according with some embodiments, FIG. 6B is a cross-sectional view taking along line B-B of FIG. 6A, and FIG. 6C is a cross-sectional view taking along line C-C of FIG. 6A. The photoresist 140 in FIGS. 5A-5C is removed by performing, for example, etching or ashing process. A gate dielectric layer 150 is then conformally formed at least in the recesses R1. That is, the gate dielectric layer 150 at least covers the top surface of the bottom portions 116b of the active regions 116 and sidewalls of the protruding portions 116p of the active regions 116. In some embodiments, the gate dielectric layer 150 further covers the top surface of the bottom portions 120b of the isolation feature 120 and sidewalls of the protruding portions 120p of the isolation feature 120. In some embodiments, the gate dielectric layer 150 may include silicon dioxide, silicon nitride, a high-κ dielectric material or other suitable material. In various examples, the gate dielectric layer 150 may be deposited by an ALD process, a CVD process, a subatmospheric CVD (SACVD) process, a PVD process, or other suitable process.

Figure 7A:
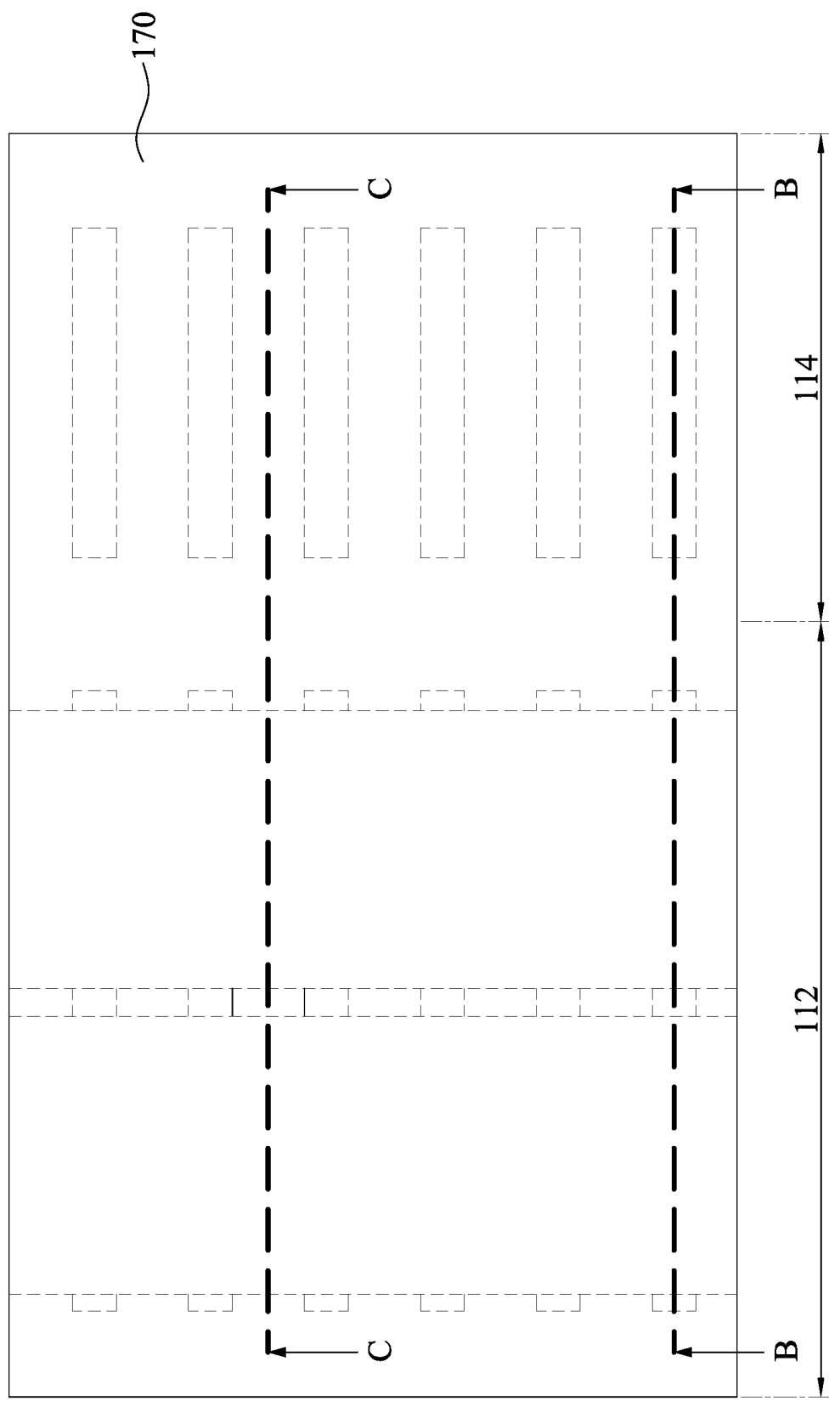
Figure 7B:
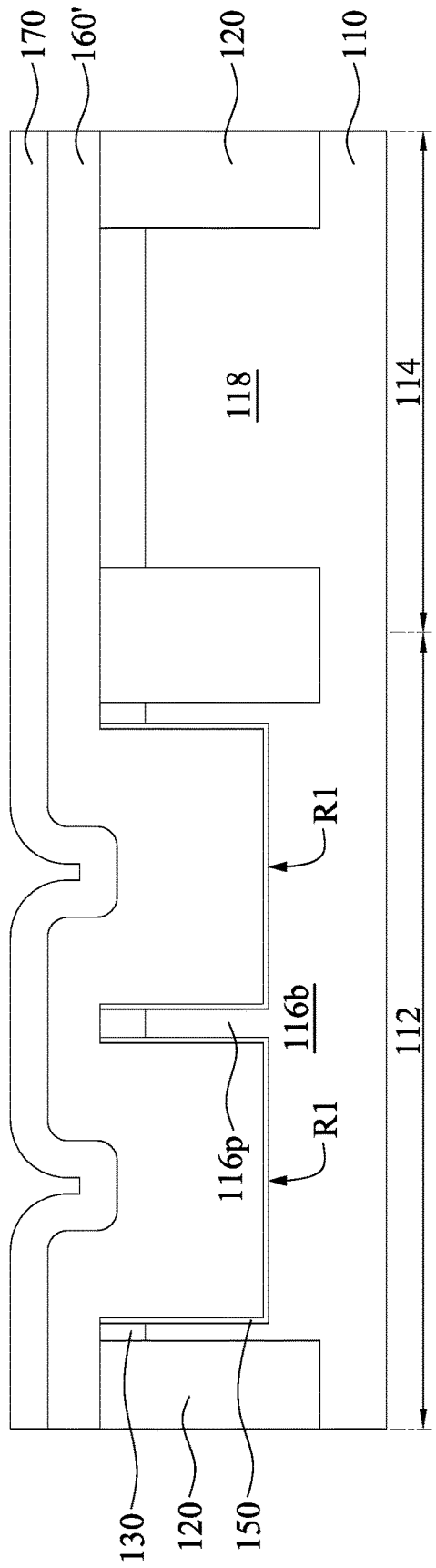
Figure 7C:
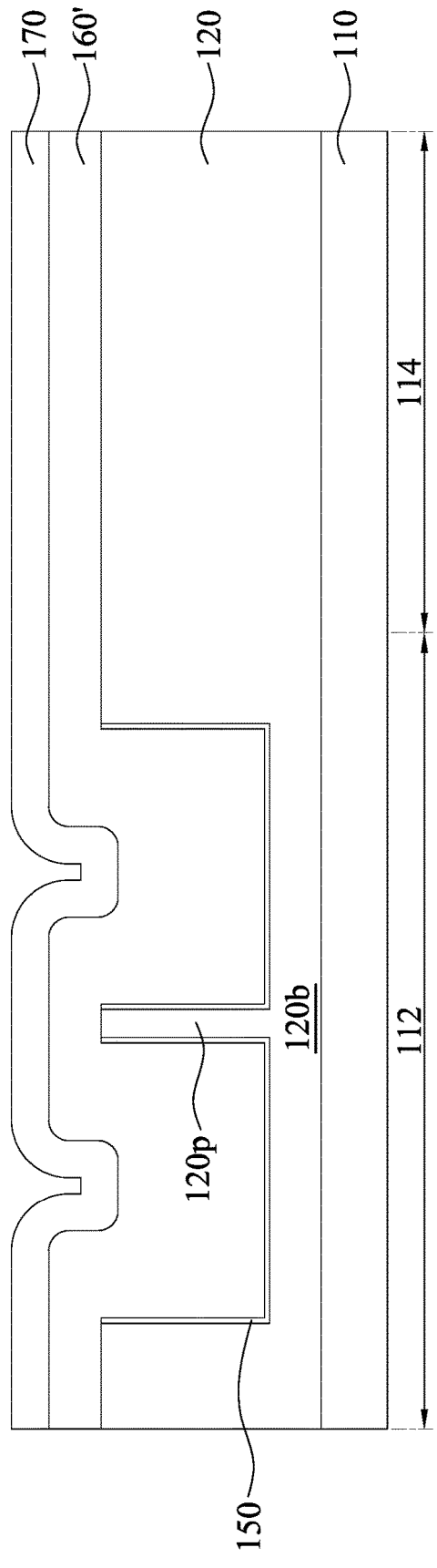

Reference is made to FIGS. 7A-7C, where FIG. 7A is a top view of the memory device according with some embodiments, FIG. 7B is a cross-sectional view taking along line B-B of FIG. 7A, and FIG. 7C is a cross-sectional view taking along line C-C of FIG. 7A. A conductive material 160' is formed to cover the structure of FIG. 6A. That is, the conductive material 160' is in the recesses R1 and over the substrate 110. In some embodiments, the conductive material 160' may be made of polycrystalline-silicon (poly-Si), poly-crystalline silicon-germanium (poly-SiGe), or other suitable materials.

Then, a photoresist layer 170 is formed over the conductive material 160'. The photoresist layer 170 may be a bottom antireflective coating (BARC) layer, which may be an organic film, a nitride film, an oxide film, or the like. The BARC layer may be formed using suitable techniques such as CVD and/or the like. The BARC layer may be used to enhance control of critical dimensions (CD) in advanced photolithography by suppressing standing wave effects and reflective notching caused by thin film interference. It is noted that the conductive material 160' and the photoresist layer 170 are of uneven surfaces due to the uneven surfaces of the recesses R1.

Figure 8A:
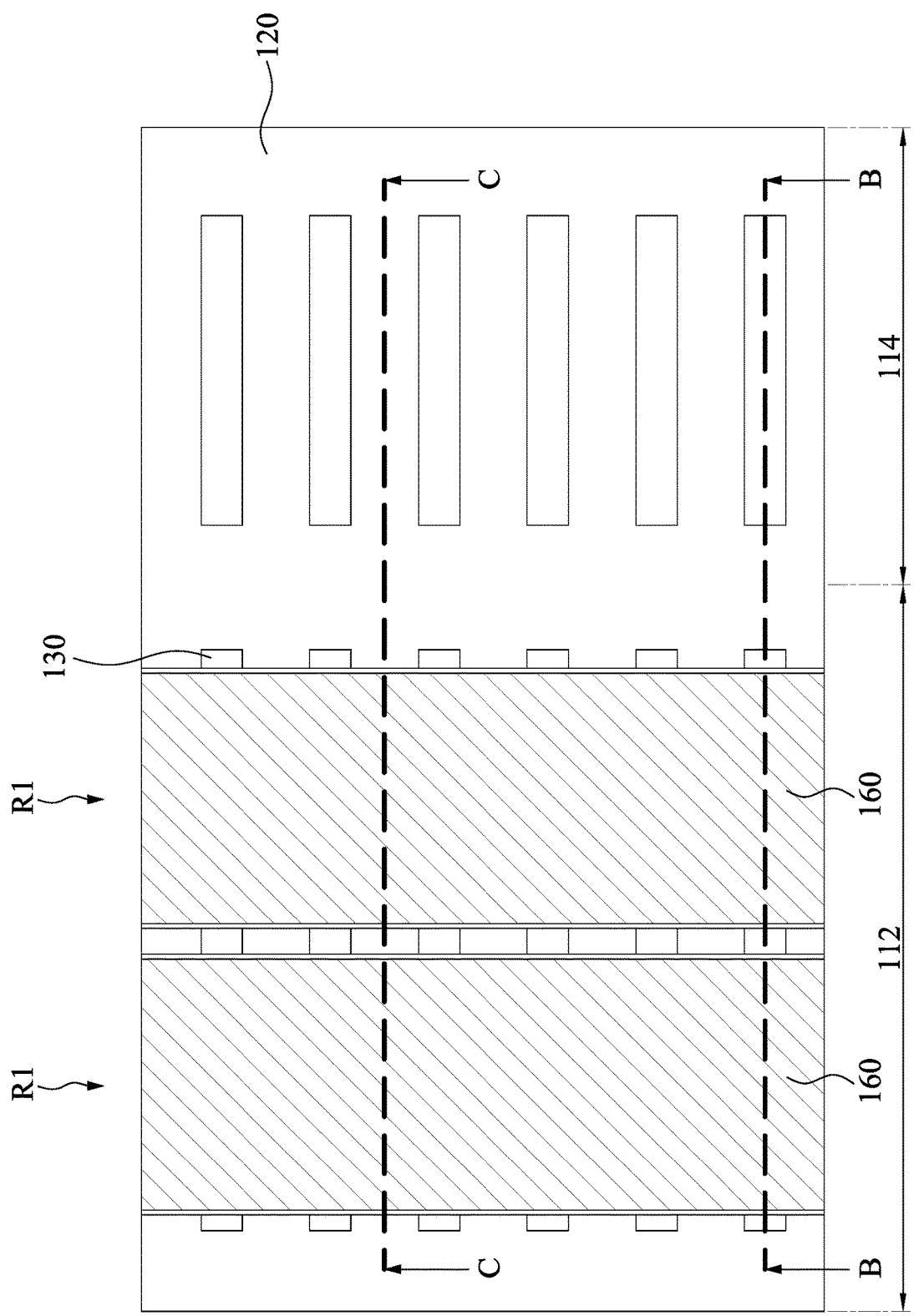

Reference is made to FIGS. 8A-8C, where FIG. 8A is a top view of the memory device according with some embodiments, FIG. 8B is a cross-sectional view taking along line B-B of FIG. 8A, and FIG. 8C is a cross-sectional view taking along line C-C of FIG. 8A. The conductive material 160' in FIGS. 7A-7C is etched back to form conductive layers 160 respectively in the recesses R1. In some embodiments, the conductive material 160' may be etched by performing a dry etching process, a wet etching process, or combinations thereof. In some embodiments, the conductive layer 160 has a height H3 less than the height H1 (see FIG. 5B). That is, a top surface of the conductive layer 160 is lower than a top surface 116pt of the protruding portion 116p. In some embodiments, the height H3 is in a range of about 35 nm to about 75 nm.

The photoresist layer 170 in FIGS. 7A-7C is removed when the etching process is applied to the conductive material 160'. The photoresist layer 170 may be removed by using suitable etching techniques including dry etching, wet etching, combinations thereof and/or the like.

Figure 9B:
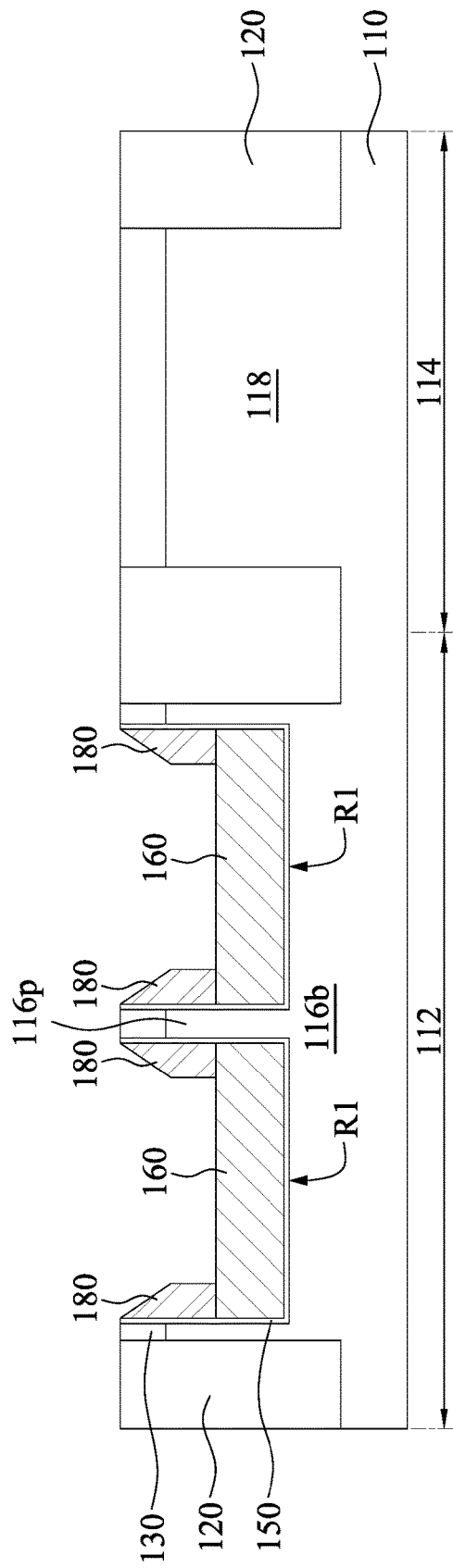
Figure 9C:
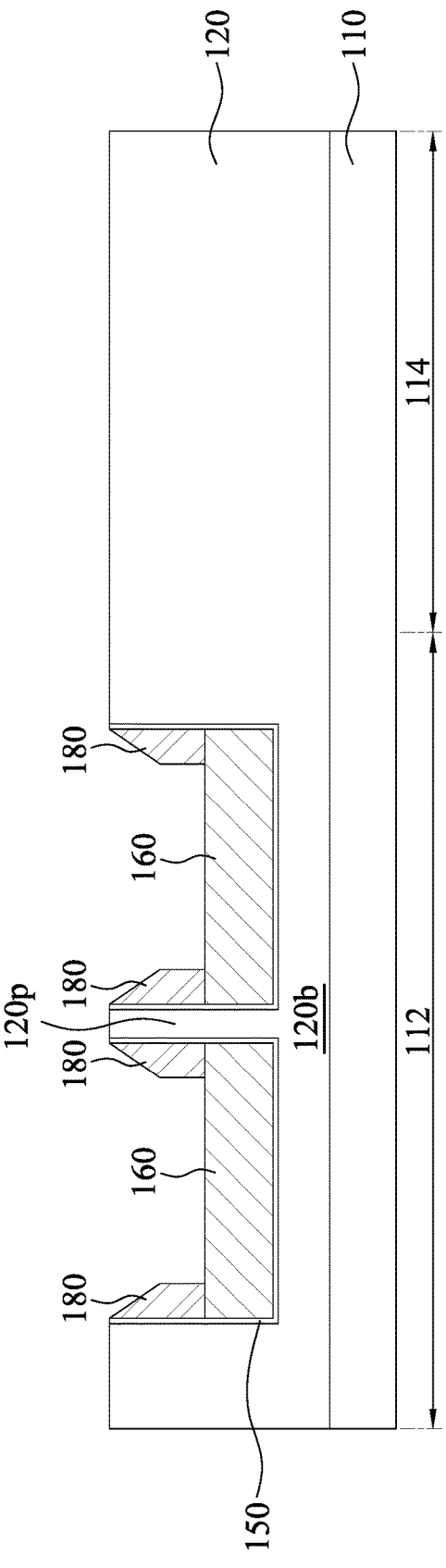

Reference is made to FIGS. 9A-9C, where FIG. 9A is a top view of the memory device according with some embodiments, FIG. 9B is a cross-sectional view taking along line B-B of FIG. 9A, and FIG. 9C is a cross-sectional view taking along line C-C of FIG. 9A. Spacer layers 180 are formed over the conductive layers 160. The spacer layers 180 may be formed using a deposition method, such as plasma enhanced chemical vapor deposition (PECVD), low-pressure chemical vapor deposition (LPCVD), sub-atmospheric chemical vapor deposition (SACVD), or the like. The formation of the spacer layers 180 may include blanket forming spacer layers over the conductive layers 160 and the patterned mask layers 130 and then performing etching operations to remove the horizontal portions of the spacer layers. The remaining vertical portions of the spacer layers form the spacer layers 180. The spacer layers 180 may be made of dielectric materials and may be an oxide layer.

In FIG. 9B, the spacer layers 180 are formed on sidewalls of the protruding portions 116p and sidewalls of the patterned mask layer 130. In FIG. 9C, the spacer layers 180 are formed on sidewalls of the protruding portions 120p of the isolation feature 120. The spacer layers 180 are further in contact with the conductive layers 160.

Figure 10B:
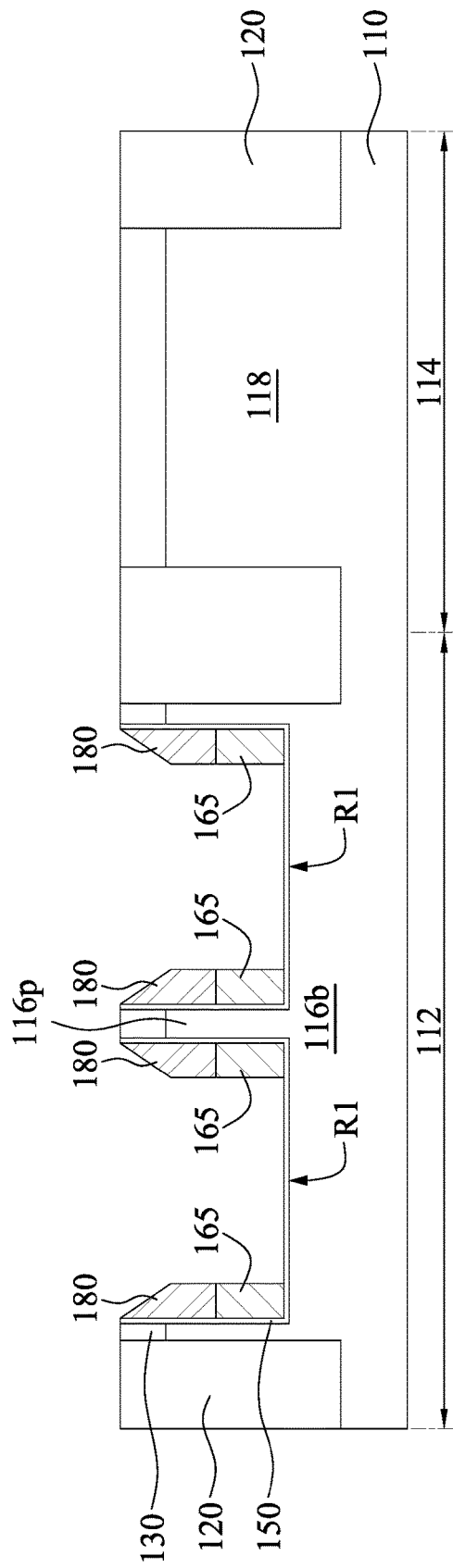
Figure 10C:
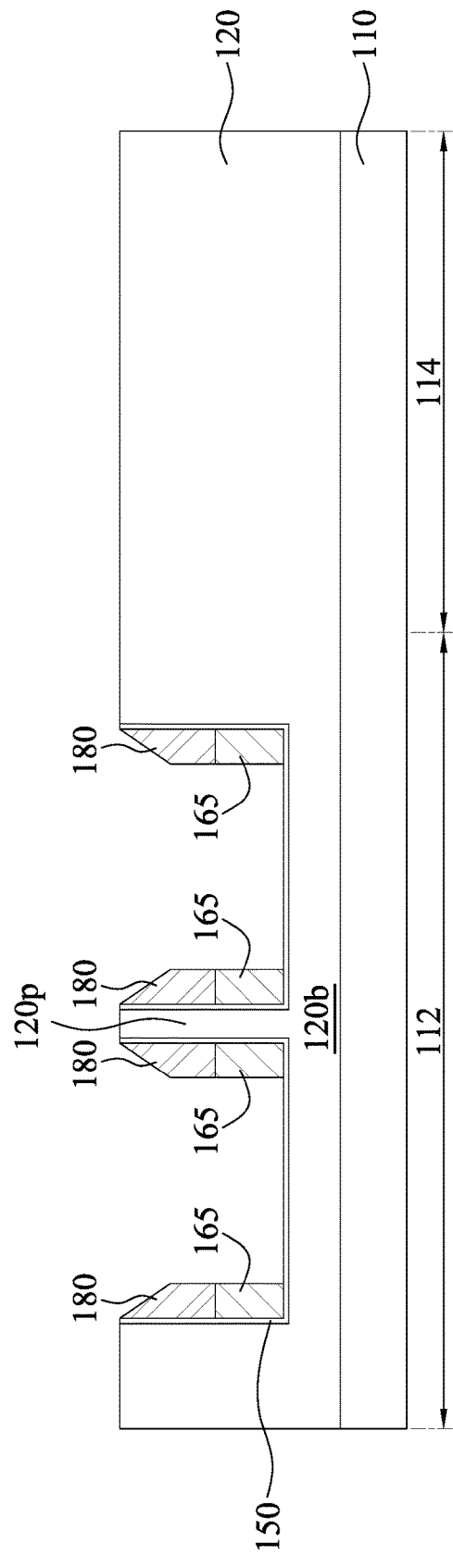

Reference is made to FIGS. 10A-10C, where FIG. 10A is a top view of the memory device according with some embodiments, FIG. 10B is a cross-sectional view taking along line B-B of FIG. 10A, and FIG. 10C is a cross-sectional view taking along line C-C of FIG. 10A. The conductive layers 160 in FIGS. 9A-9C are patterned to form select gates 165 respectively below the spacer layers 180. For example, the conductive layers 160 are patterned using the spacer layers 180 as masks. Moreover, portions of the gate dielectric layers 150 are exposed by the select gates 165.

Figure 11A:
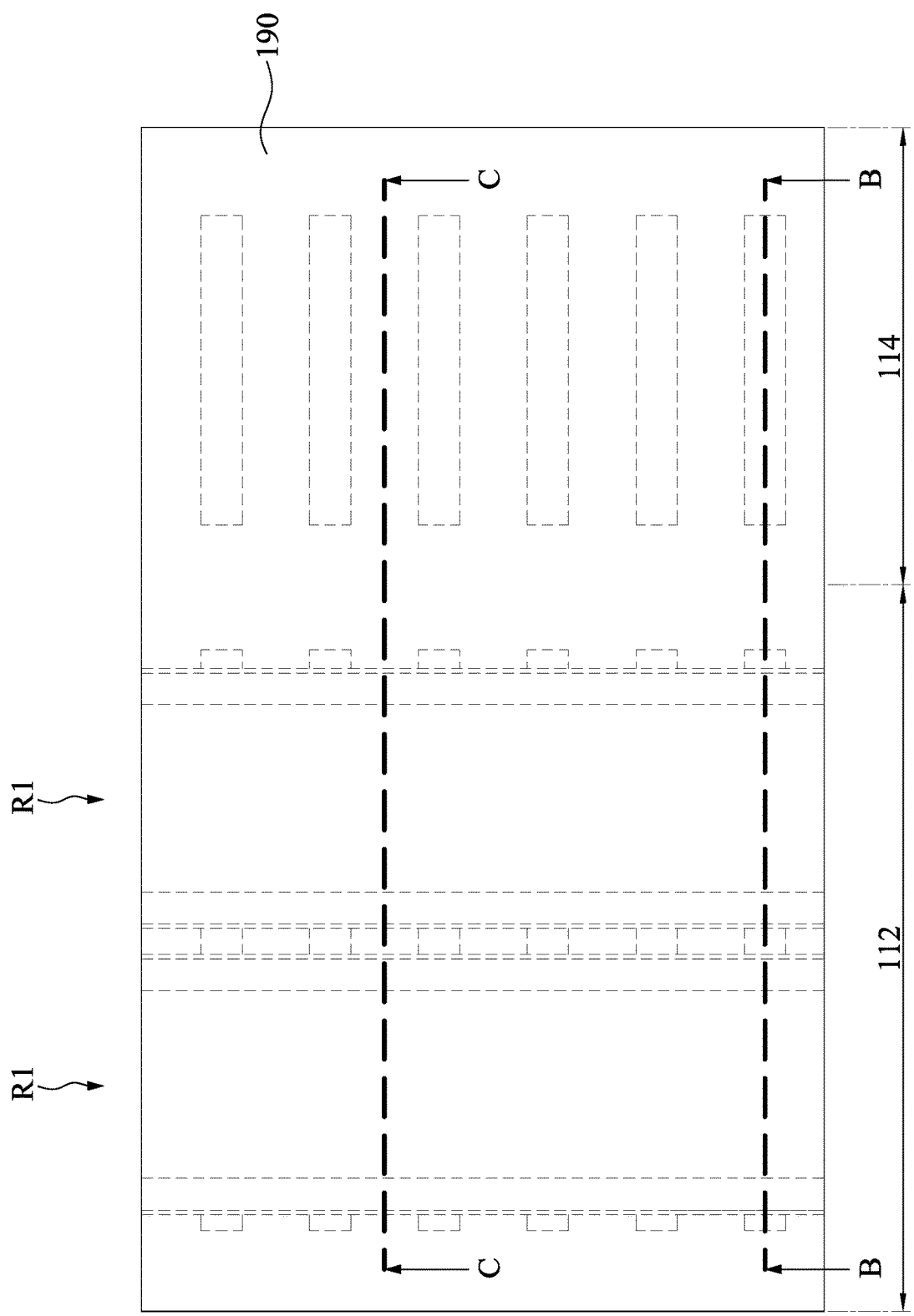
Figure 11B:
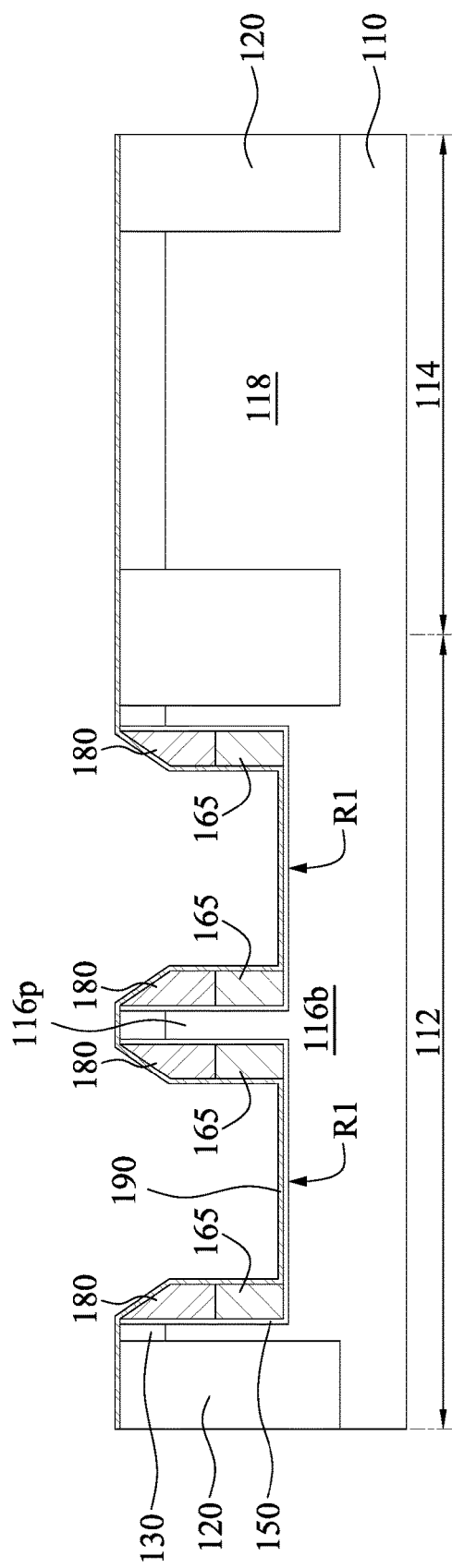
Figure 11C:
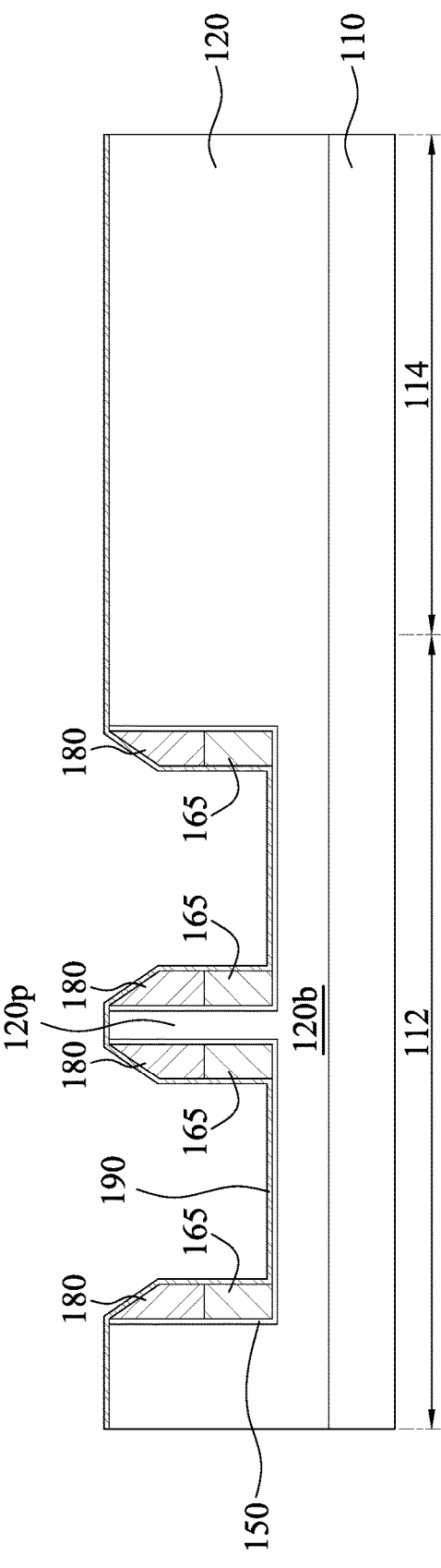

Reference is made to FIGS. 11A-11C, where FIG. 11A is a top view of the memory device according with some embodiments, FIG. 11B is a cross-sectional view taking along line B-B of FIG. 11A, and FIG. 11C is a cross-sectional view taking along line C-C of FIG. 11A. A blocking film 190 is formed over the structure of FIGS. 10A-10C. That is, the blocking film 190 is formed over the spacer layers 180, the select gates 165, the gate dielectric layer 150, and the patterned mask layer 130. The select gate 165 is surrounded by the gate dielectric layer 150, the spacer layer 180, and the blocking film 190. In some embodiments, the blocking film 190 has an oxide-nitride-oxide (ONO) structure including an oxide layer, a nitride layer over the oxide layer, and additional oxide layer over the nitride layer. In alternative embodiments, other materials such as a single oxide layer, a single high-k dielectric layer, a single nitride layer, or multi-layers thereof, may also be used.

Figure 12A:
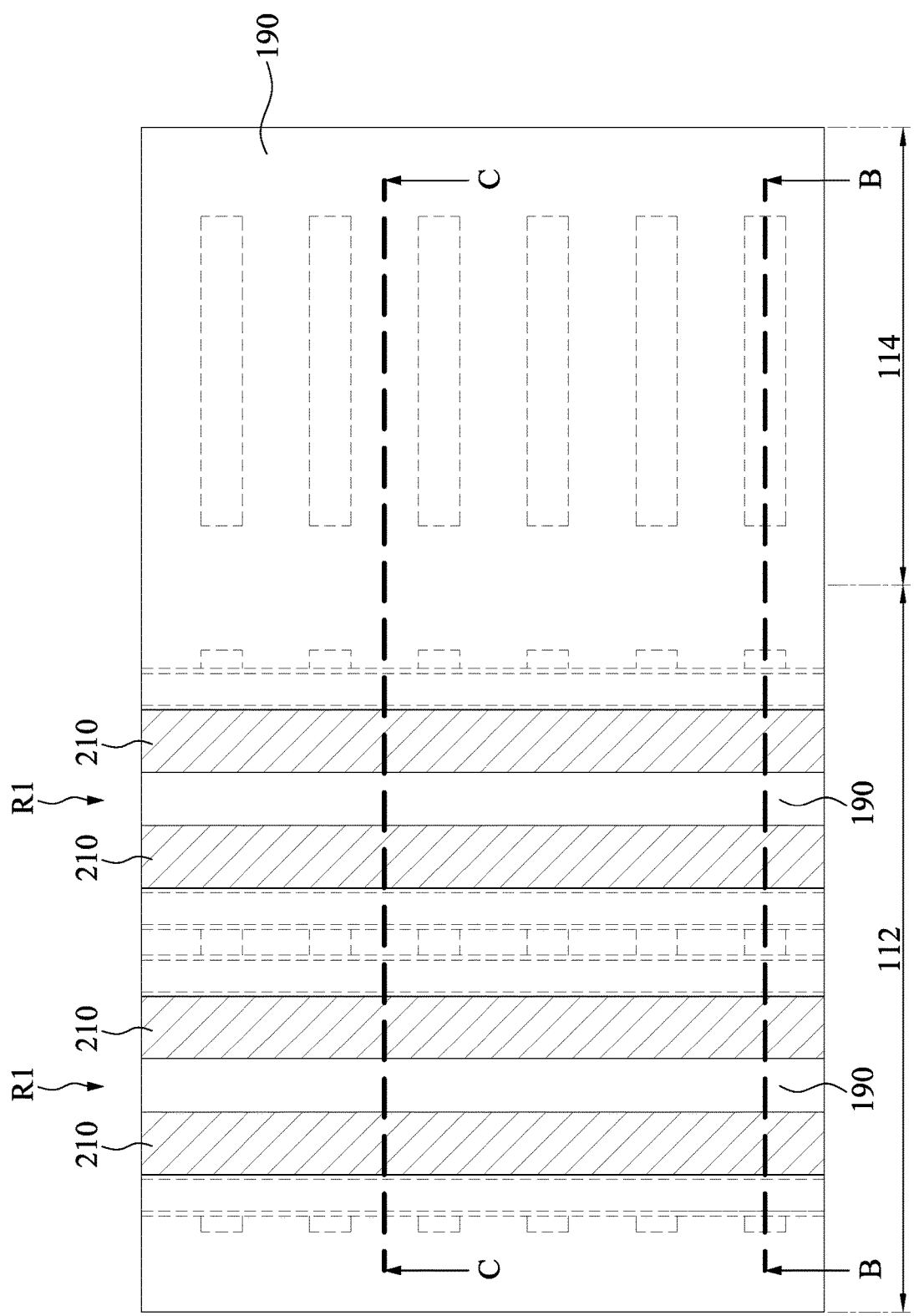
Figure 12B:
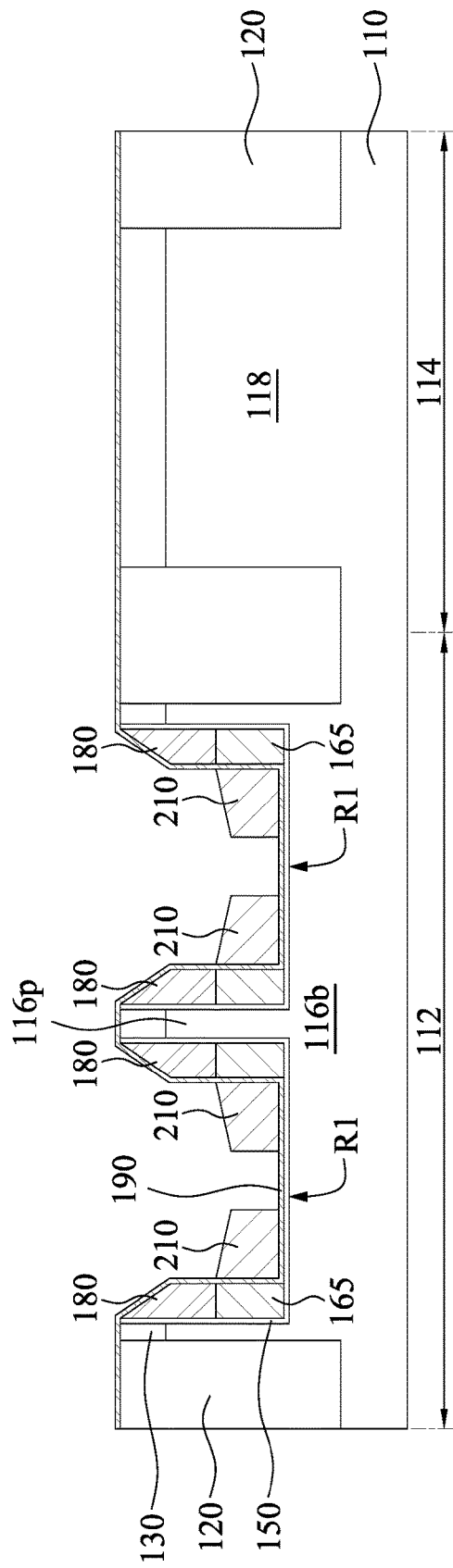
Figure 12C:
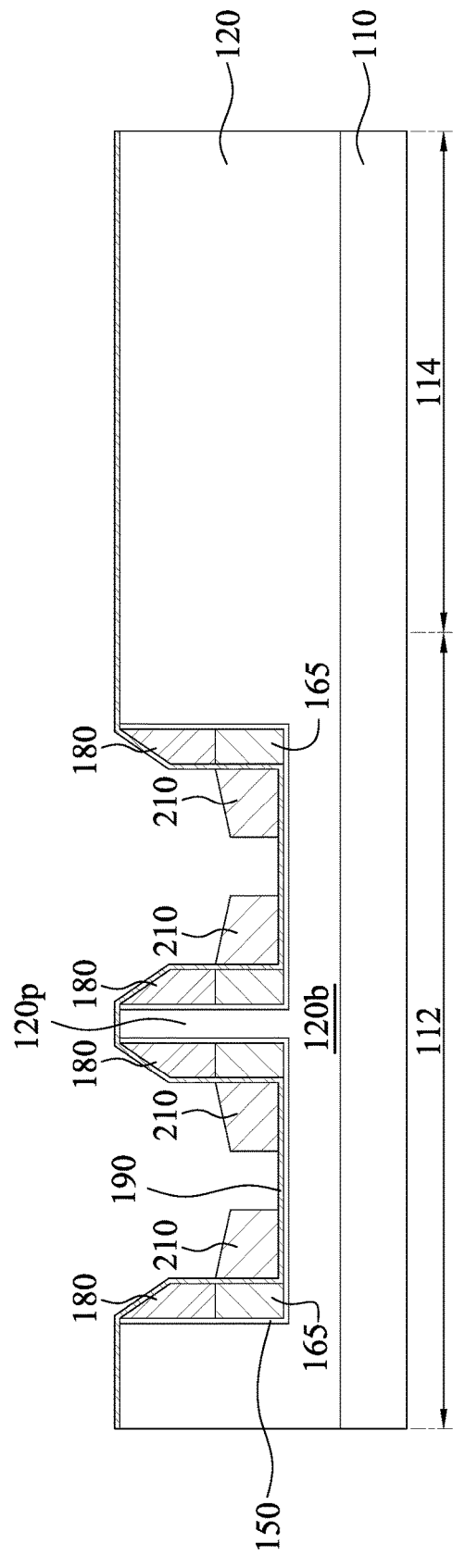

Reference is made to FIGS. 12A-12C, where FIG. 12A is a top view of the memory device according with some embodiments, FIG. 12B is a cross-sectional view taking along line B-B of FIG. 12A, and FIG. 12C is a cross-sectional view taking along line C-C of FIG. 12A. Control gates 210 are formed over the blocking film 190. The control gates 210 may be formed of a metal-containing material including a metal or a metal alloy. The exemplary metal-containing materials include Pt, WN, Ni, Ru, Mo, Ti, Ta, Nb, Al, $TiSi_2$, or the like. In yet alternative embodiments, the control gates 210 may be made of polysilicon. For example, a conformal conductive layer may be formed over the structure of FIGS. 11A-11C, and a patterning process is performed to the conductive layer to form the control gates 210. As such, the control gates 210 are formed over the blocking film 190. Further, a portion of the blocking film 190 is sandwiched between one of the control gates 210 and one of the select gates 165. That is, the portion of the blocking film 190 is in contact with the control gate 210 and the select gate 165.

Figure 13A:
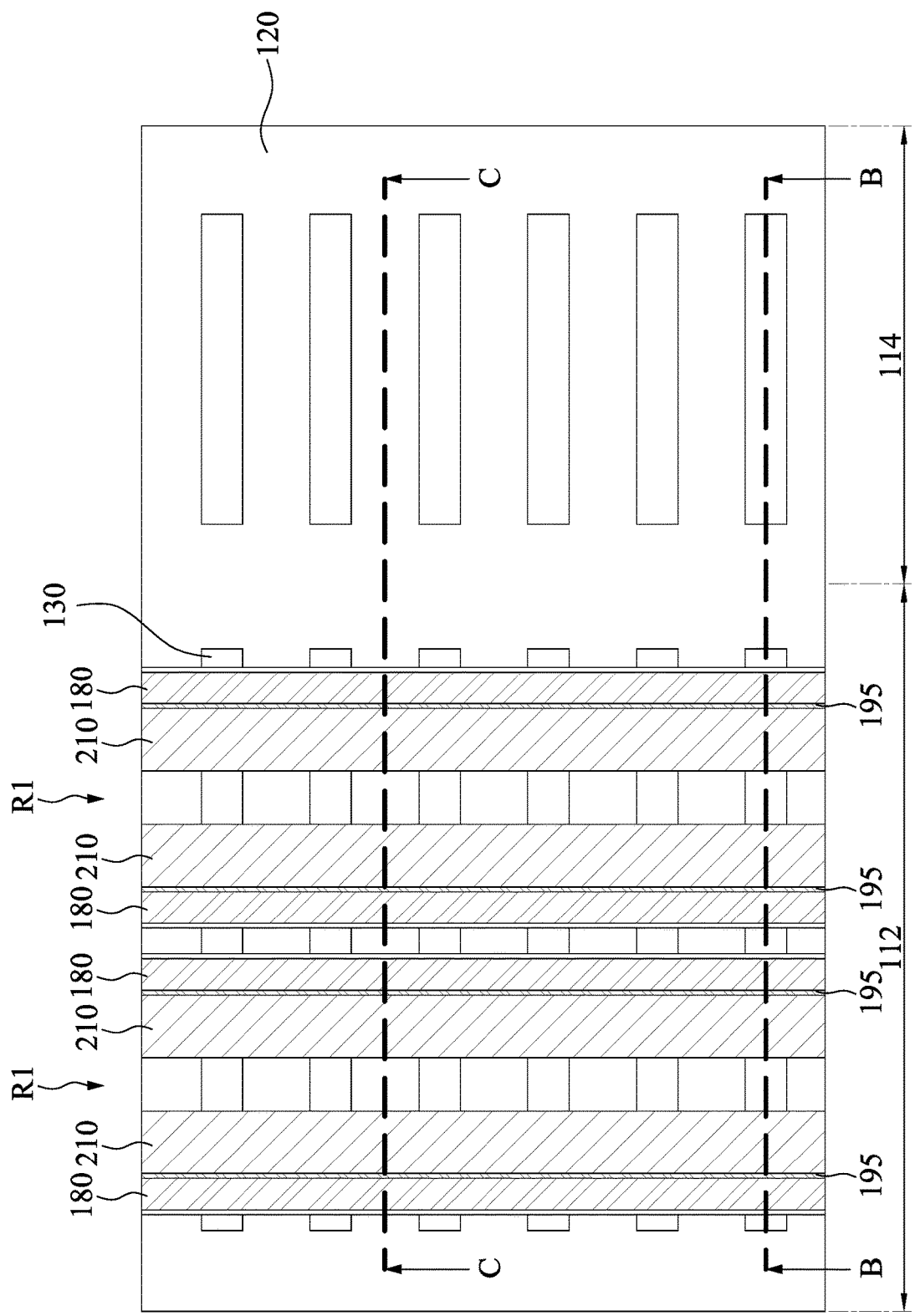
Figure 13B:
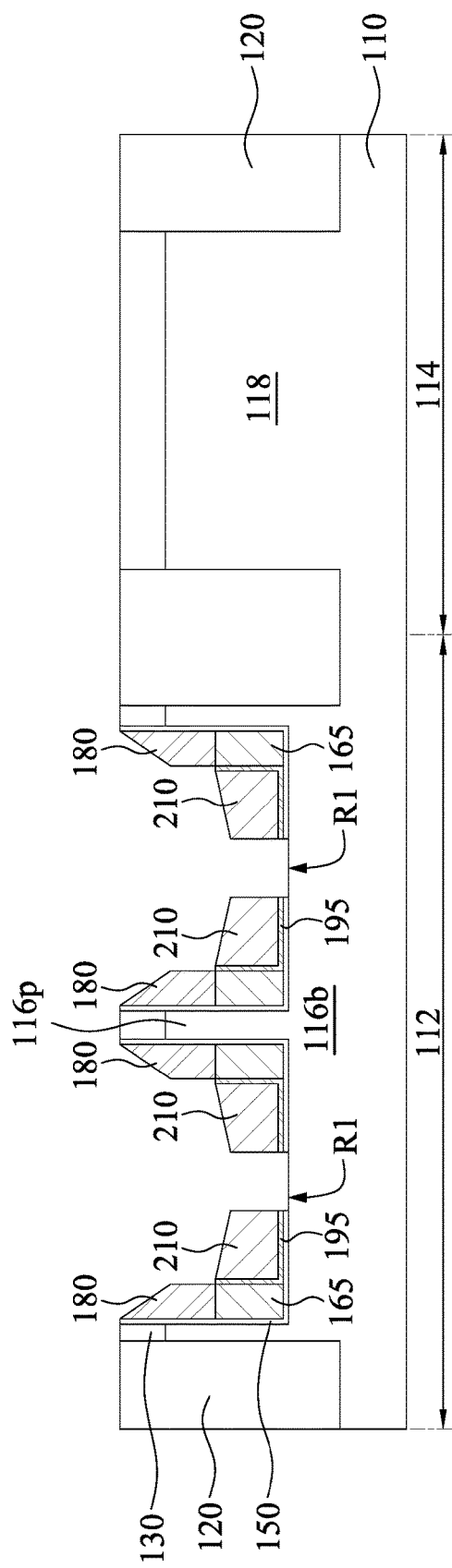
Figure 13C:
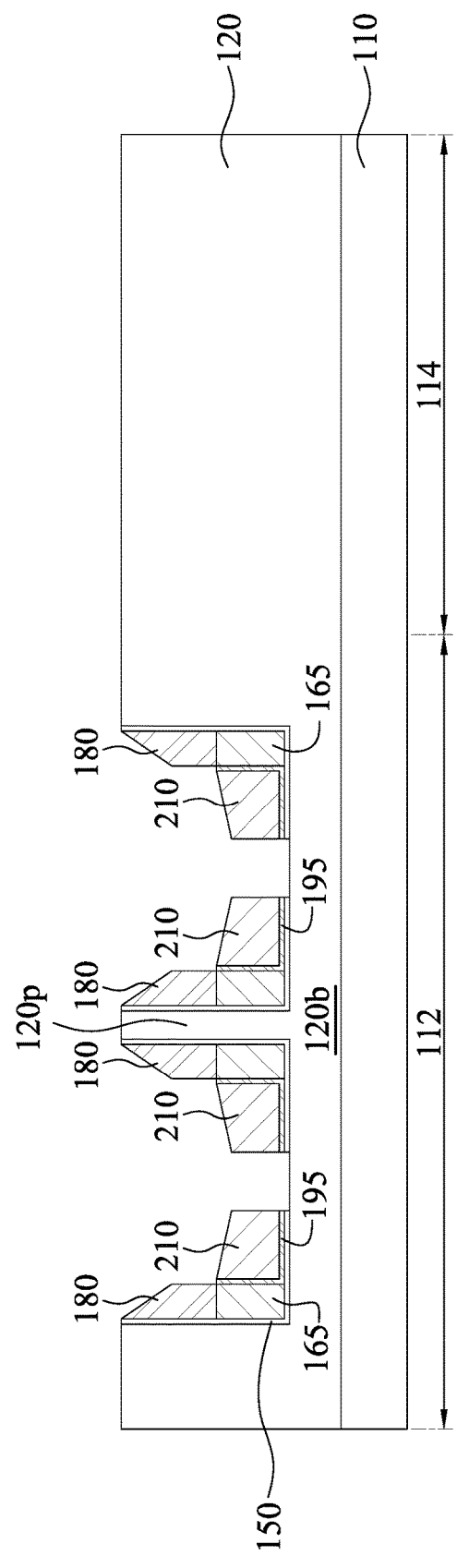

Reference is made to FIGS. 13A-13C, where FIG. 13A is a top view of the memory device according with some embodiments, FIG. 13B is a cross-sectional view taking along line B-B of FIG. 13A, and FIG. 13C is a cross-sectional view taking along line C-C of FIG. 13A. The blocking film 190 of FIGS. 12A-12C is patterned to be blocking layers 195. Each of the blocking layers 195 is between and in contact with one of the control gates 210 and one of the select gates 165. The control gate 210 and the select gate 165 are on opposite sides of the blocking layer 195. During this process, portions of the gate dielectric layer 150 exposed by the control gates 210 and the select gates 165 are removed as well, such that portions of the bottom portions 116b of the active regions 116 are exposed.

Figure 14A:
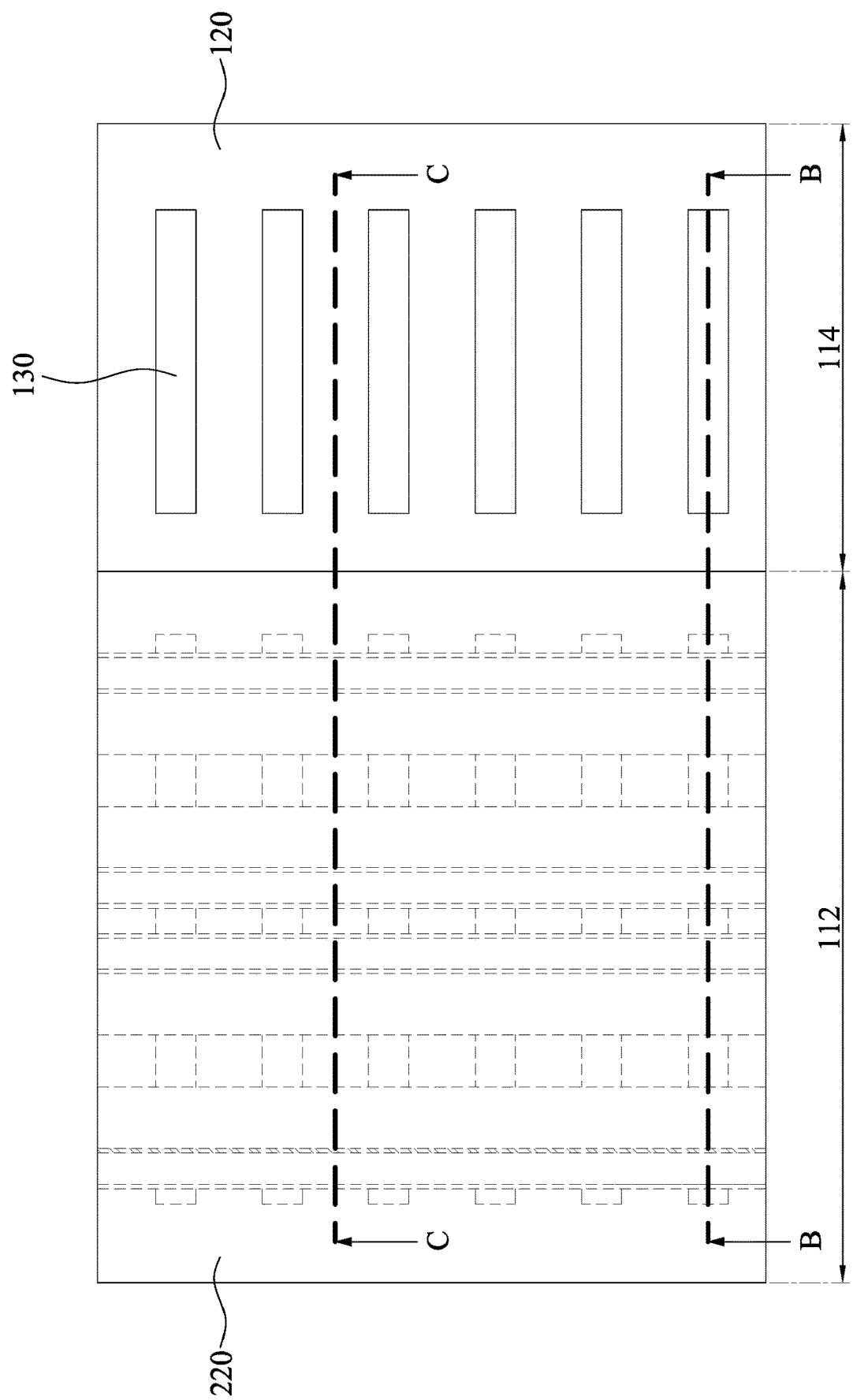
Figure 14B:
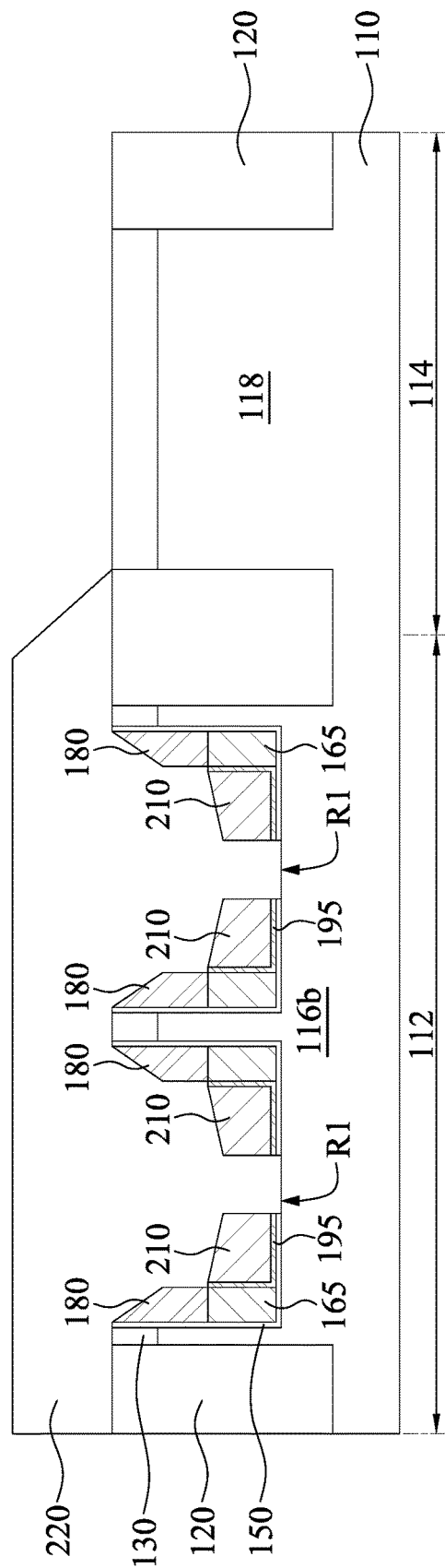
Figure 14C:
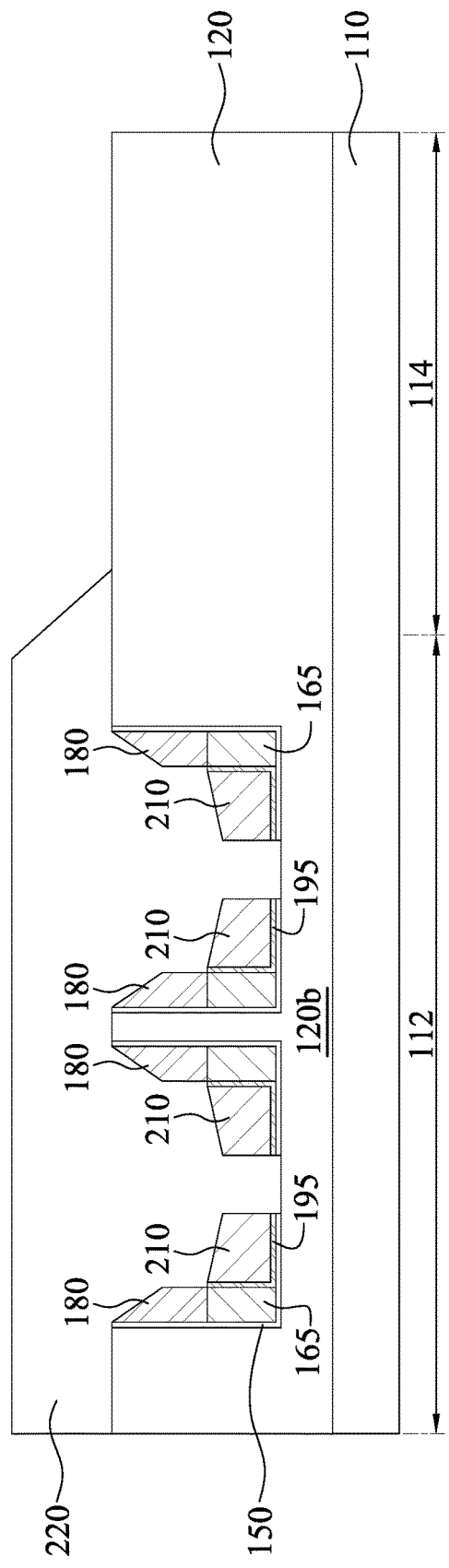

Reference is made to FIGS. 14A-14C, where FIG. 14A is a top view of the memory device according with some embodiments, FIG. 14B is a cross-sectional view taking along line B-B of FIG. 14A, and FIG. 14C is a cross-sectional view taking along line C-C of FIG. 14A. A protection layer 220 is formed over the cell region 112 of the substrate 110, such that the protection layer 220 covers the structures formed over the substrate 110 (i.e., the active regions 116, the select gates 165, the spacer layers 180, the control gates 210, and the patterned mask layers 130). The protection layer 220 may be made of polysilicon or other suitable materials. The protection layer 220 has a tapered profile, and the protection layer 220 tapers towards the peripheral region 114 of the substrate 110. The protection layer 220 exposes the peripheral region 114, such that the protection layer 220 expose portions of the patterned mask layers 130 formed over the peripheral region 114.

Figure 15A:
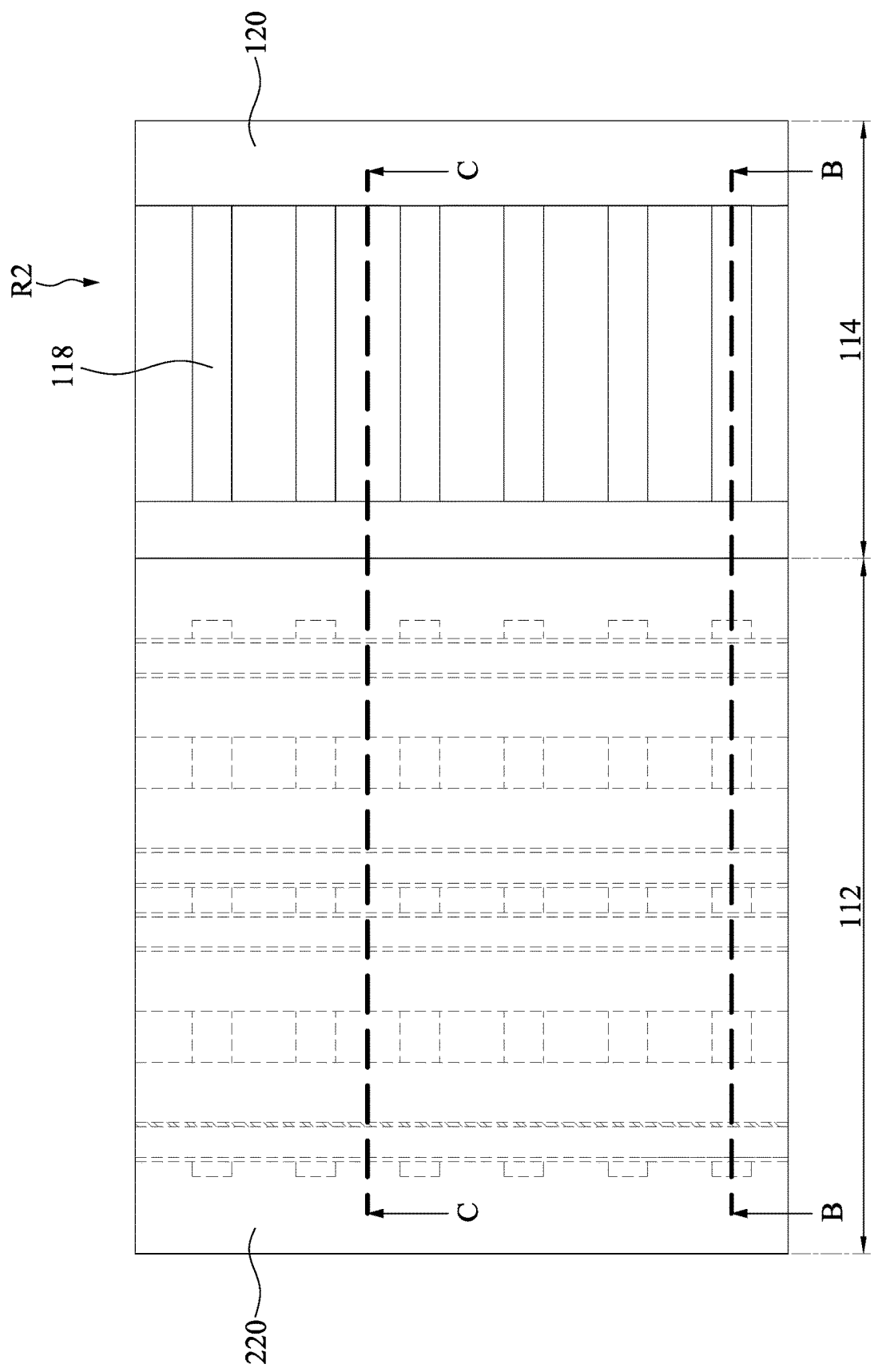

Reference is made to FIGS. 15A-15C, where FIG. 15A is a top view of the memory device according with some embodiments, FIG. 15B is a cross-sectional view taking along line B-B of FIG. 15A, and FIG. 15C is a cross-sectional view taking along line C-C of FIG. 15A. The patterned mask layers 130 over the peripheral region 114 are removed, such that the active regions 118 over the peripheral region 114 are exposed. In some embodiments, the patterned mask layers 130 may be removed by performing a dry etching process, a wet etching process, or combinations thereof. Then, at least one recess R2 is formed in the active regions 118 over the peripheral region 114 by performing, for example, an etching process. In some embodiments, the top surface 119t of the active regions 118 over the peripheral region 114 is higher than a top surface 116tb of the bottom portions 116b of the active region 116 over the cell region 112. In some embodiments, the top surface 119t of the active regions 118 over the peripheral region 114 is lower than a top surface 116tp of the protruding portions 116p of the active region 116 over the cell region 112. In some embodiments, the depth of the recess R2 depends on the height of the gate structure of a transistor formed over the peripheral region 114. In some embodiments, the manufacturing process of the recesses R2 is the same or similar to the manufacturing process of the recesses R1 shown in FIGS. 5A-5C, and the detailed descriptions thereof are not repeated herein.

Figure 16A:
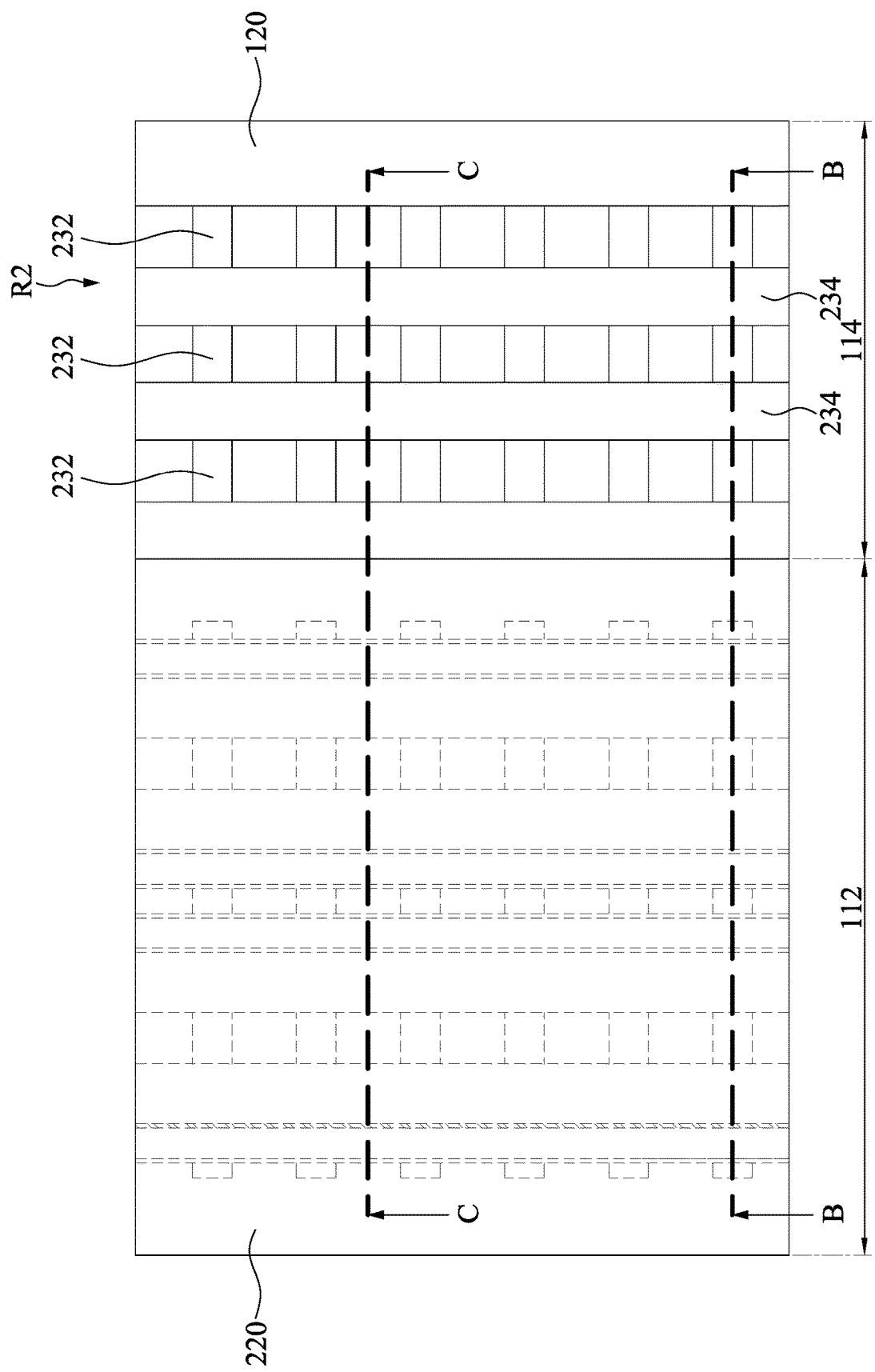
Figure 16B:
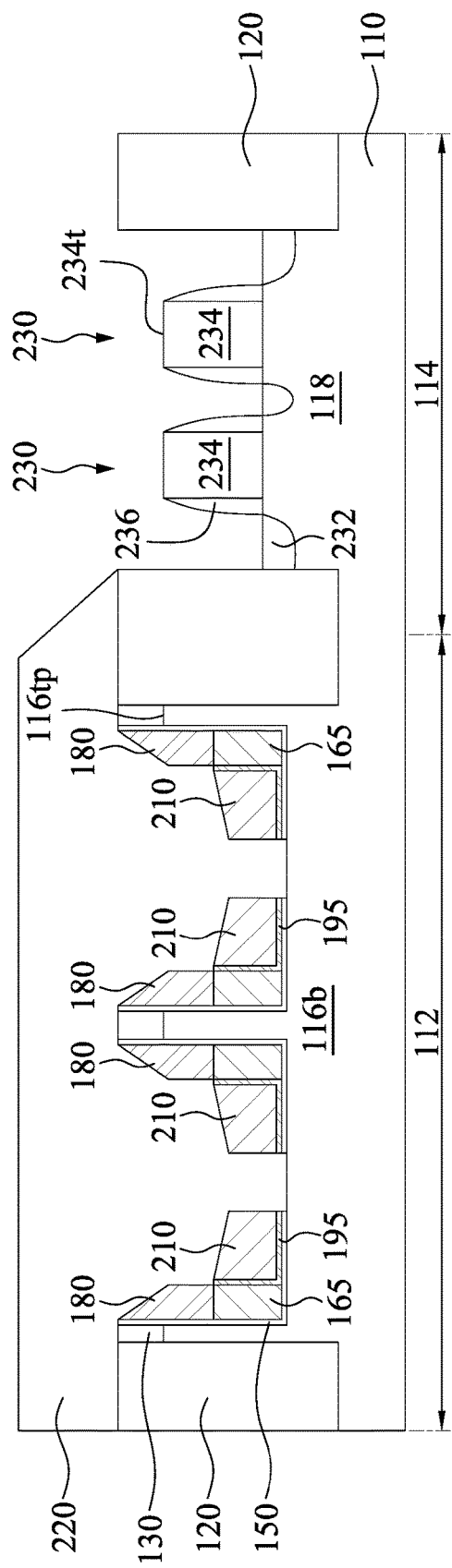
Figure 16C:
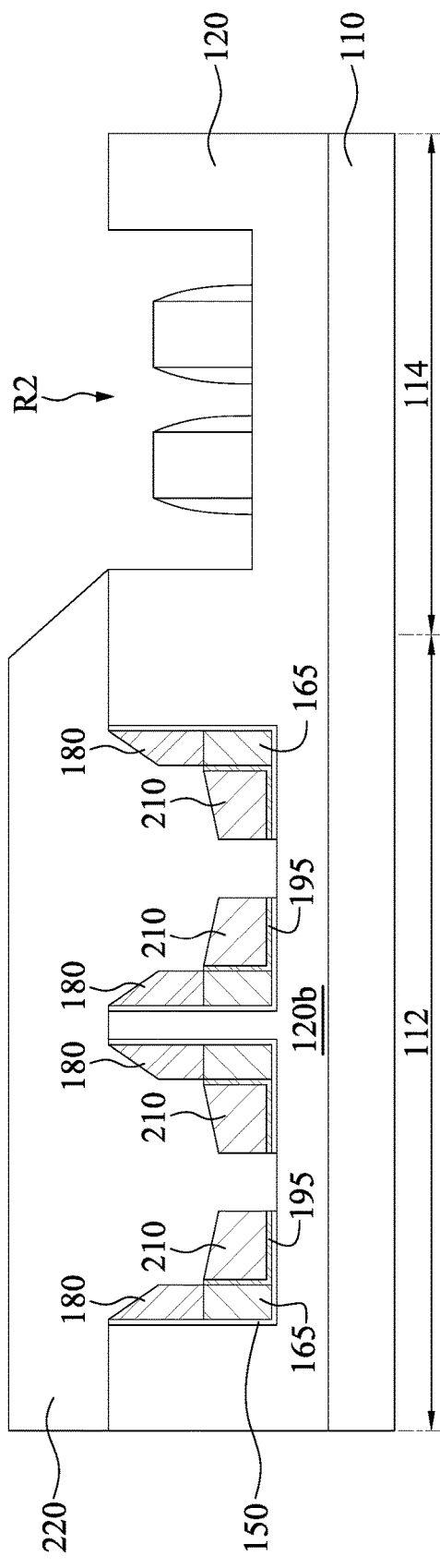
Figure 19A:
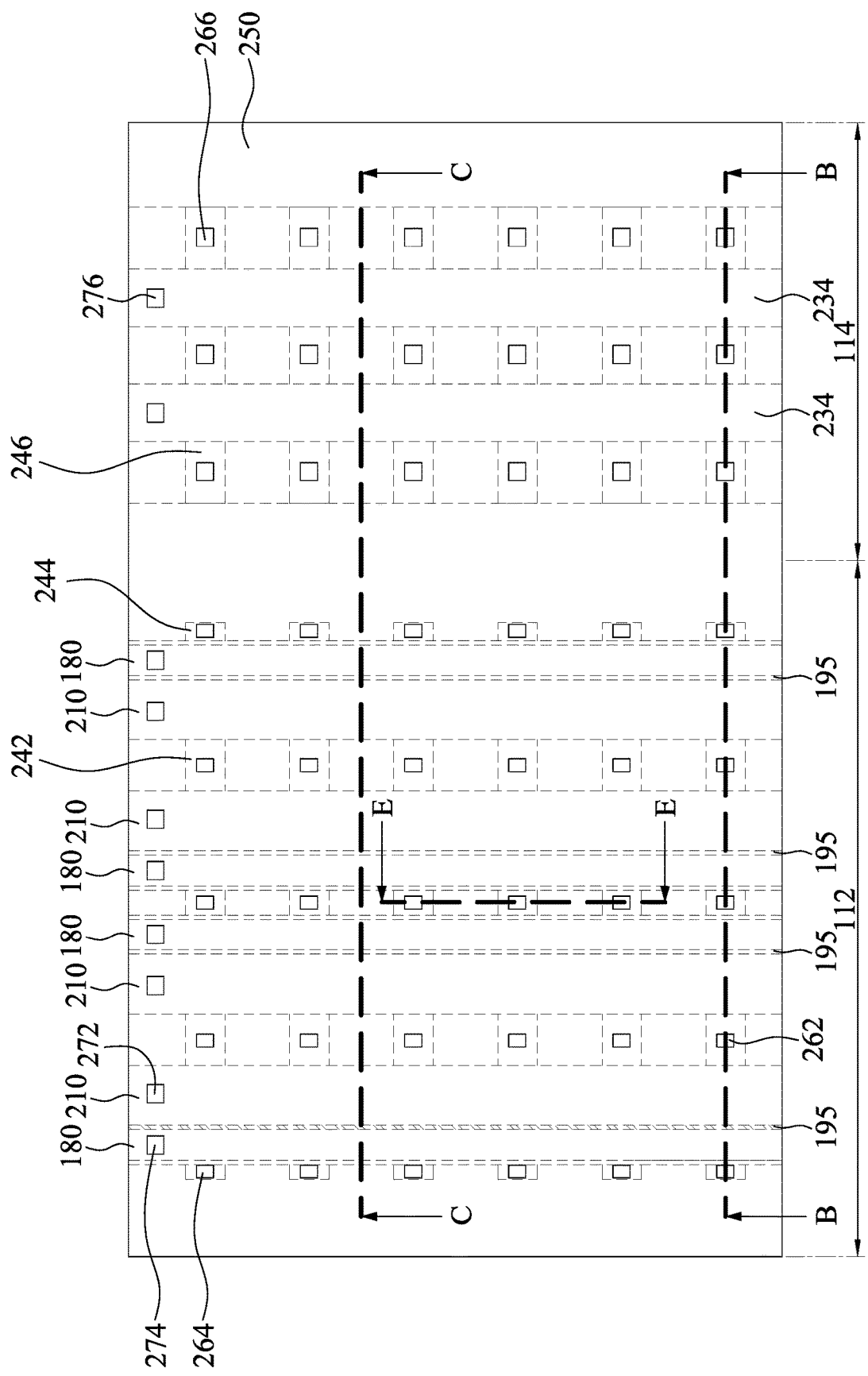
FIG. 19D is an enlarged view of an area A in FIG. 19B.
FIG. 19E is a cross-sectional view taking along line E-E in FIG. 19A.
Figure 19B:
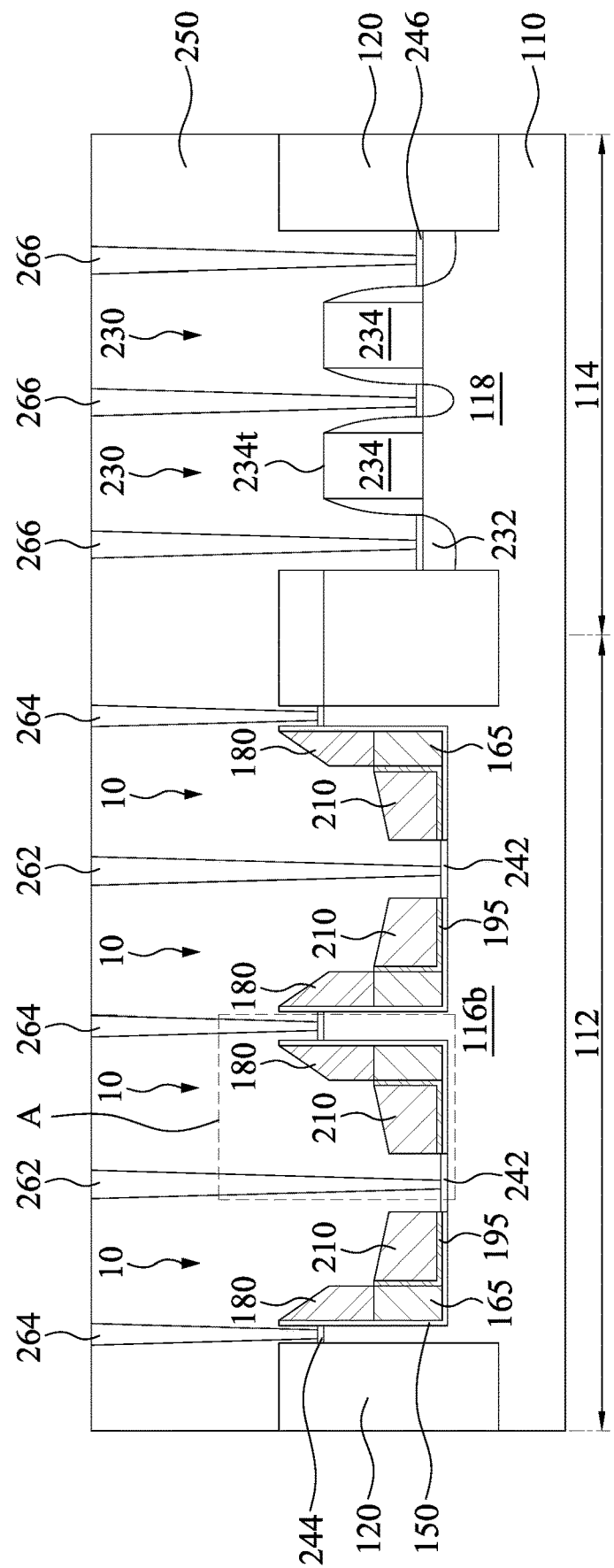
Figure 19C:
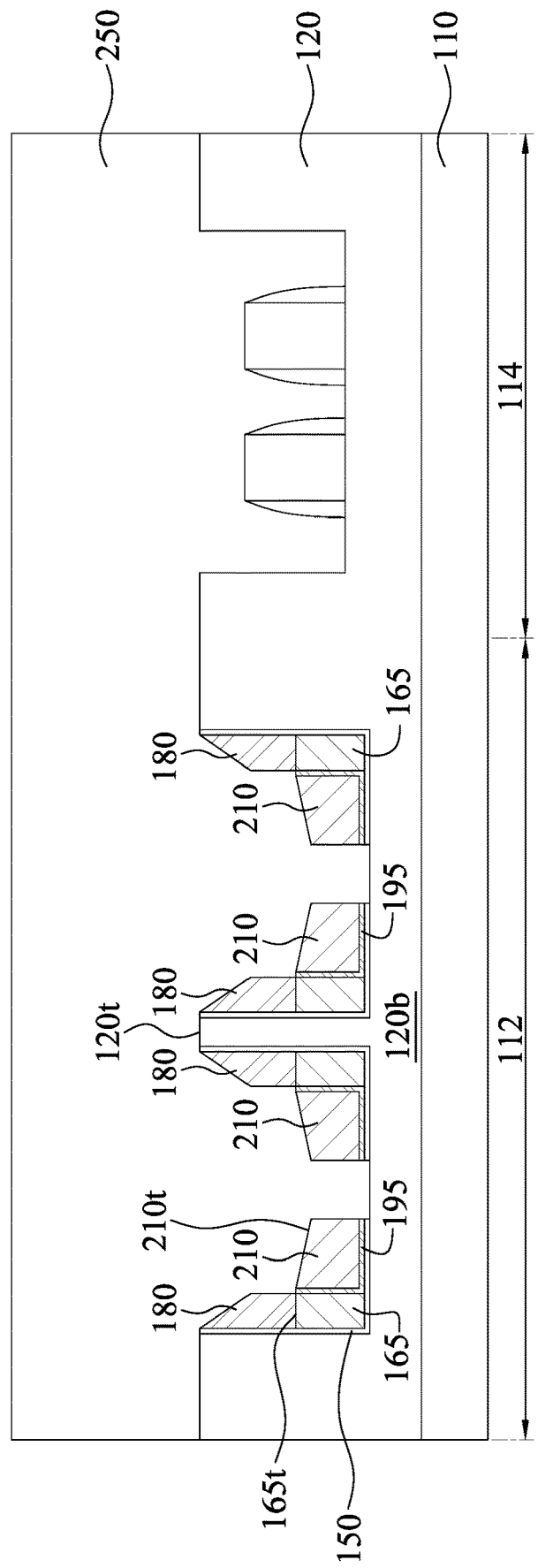

Reference is made to FIGS. 16A-16C, where FIG. 16A is a top view of the memory device according with some embodiments, FIG. 16B is a cross-sectional view taking along line B-B of FIG. 16A, and FIG. 16C is a cross-sectional view taking along line C-C of FIG. 16A. A plurality of semiconductor devices 230 are formed over the active regions 116 of peripheral region 114. In some embodiments, the semiconductor device 230 may be a transistor (such as a high-κ metal gate (HKMG) transistor, and/or a logic transistor), and the present disclosure is not limited in this respect. In some embodiments, the semiconductor device 230 includes source/drain regions 232, a gate structure 234, and gate spacers 236. The gate structure 234 is between the source/drain regions 232, and the gate spacers 236 are at least on opposite sides of the gate structure 234. For clarity, the details of the semiconductor device 230 are shown in FIG. 16B and are omitted in FIG. 16A. In some embodiments, a top surface 234t of the gate structure 234 is substantially coplanar with the top surface 116tp of the protruding portion 116p of the active region 116 to simplify the formation of the contacts (as shown in FIGS. 19A-19C).

Figure 17A:
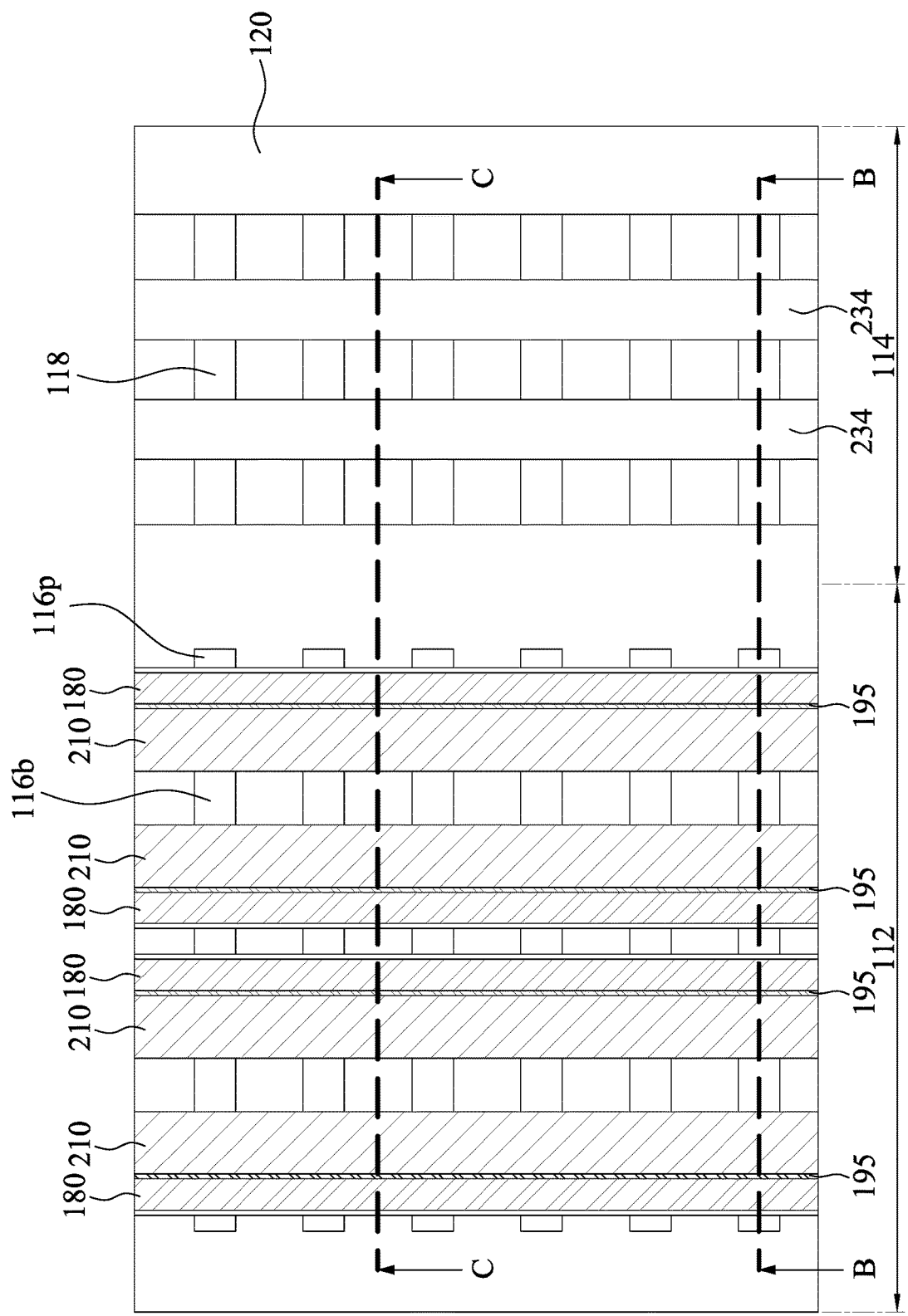
Figure 17B:
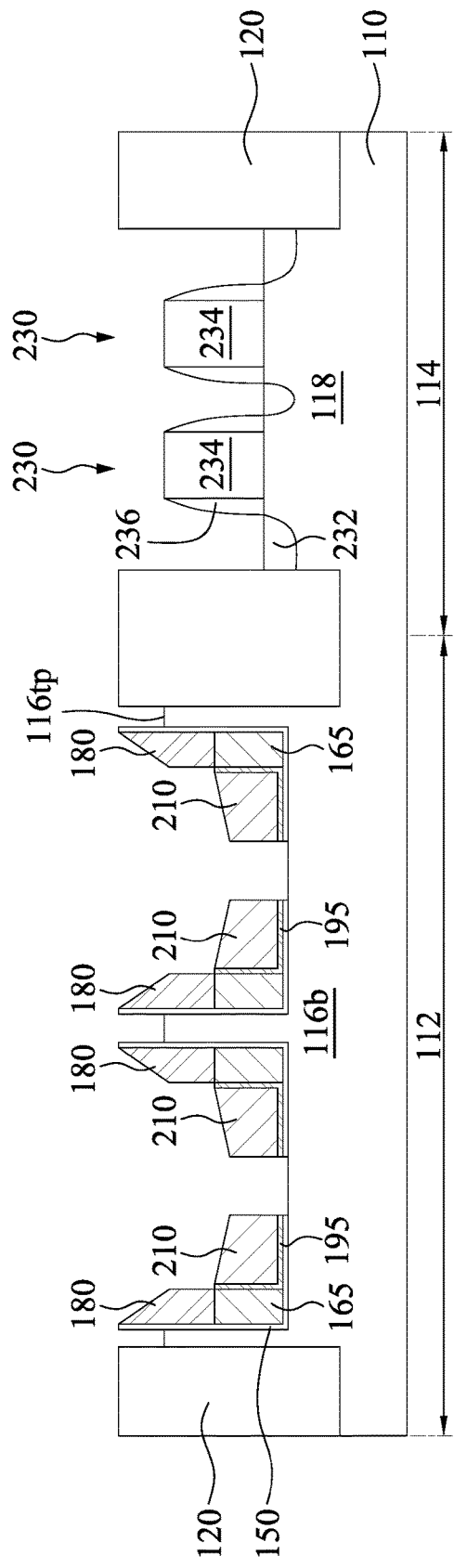
Figure 17C:
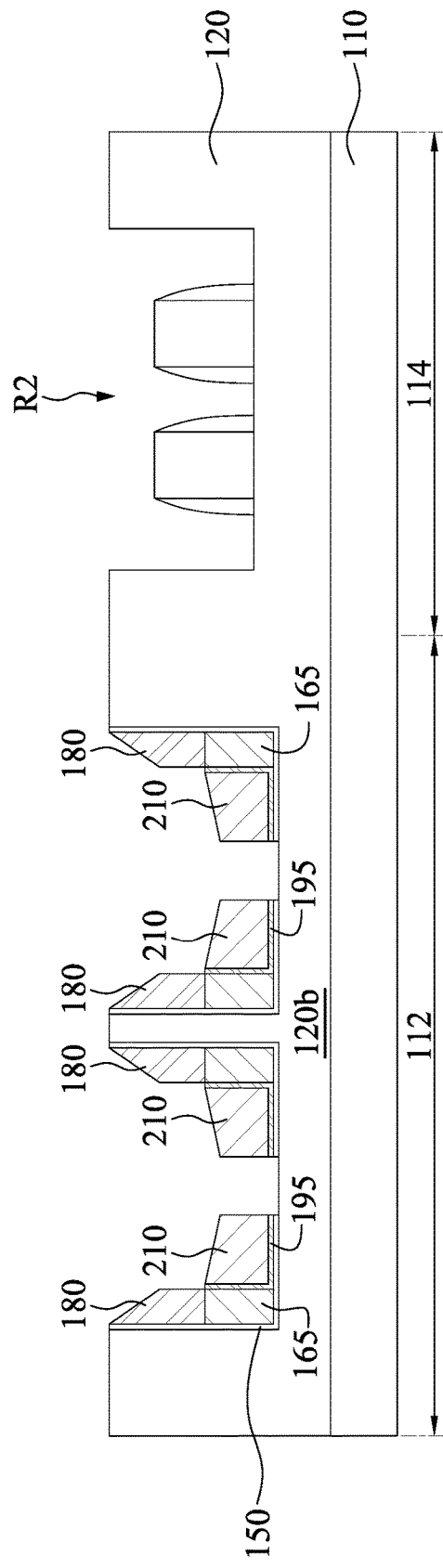

Reference is made to FIGS. 17A-17C, where FIG. 17A is a top view of the memory device according with some embodiments, FIG. 17B is a cross-sectional view taking along line B-B of FIG. 17A, and FIG. 17C is a cross-sectional view taking along line C-C of FIG. 17A. The protection layer 220 (see FIGS. 16A-16C) is removed by performing, for example, an etching process. Then, the patterned mask layers 130 (see FIGS. 16A-16C) over the cell region 112 are removed by performing, for example, an etching process, such that the top surface 116tp of the protruding portion 116p are exposed.

Figure 18A:
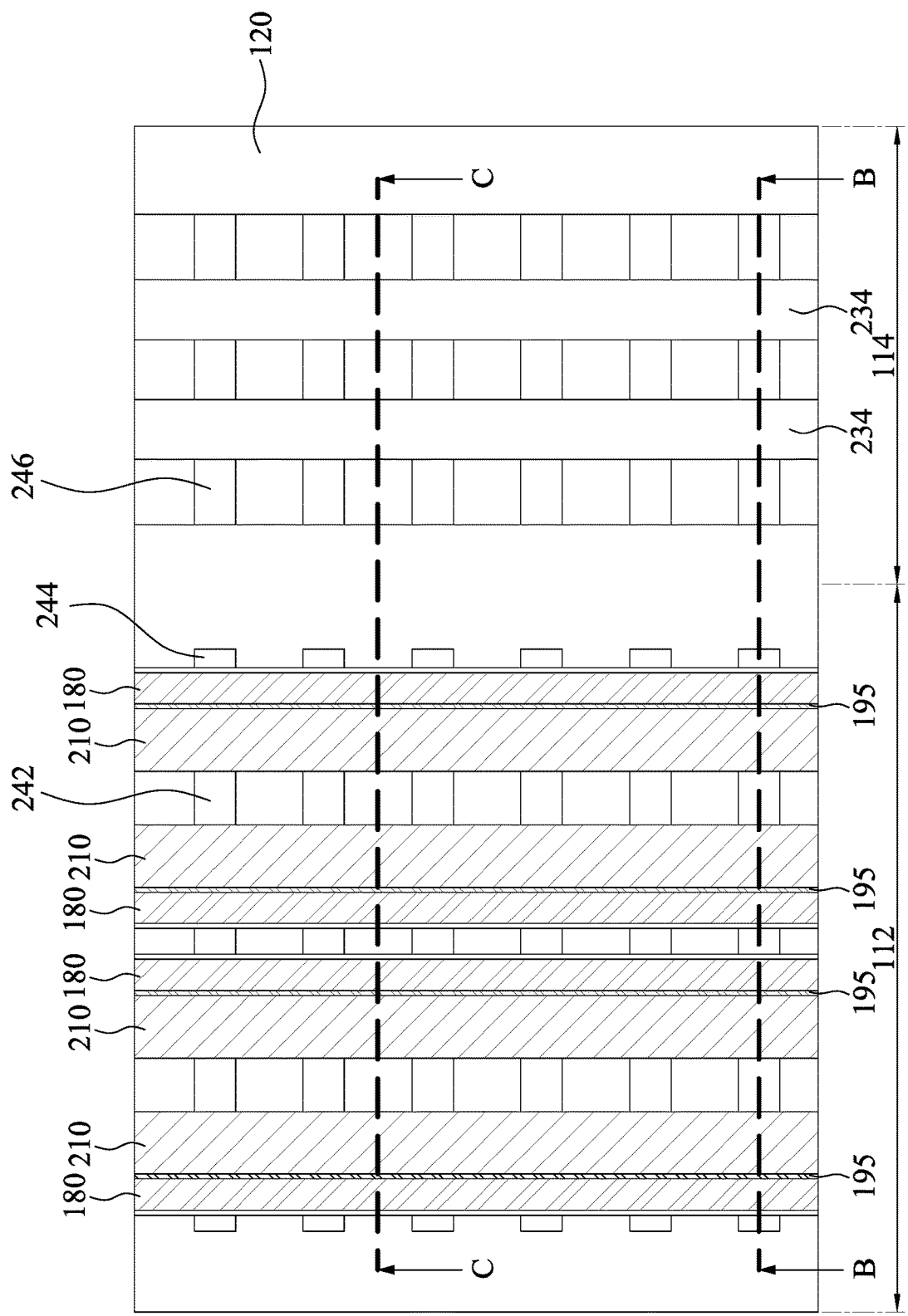
Figure 18B:
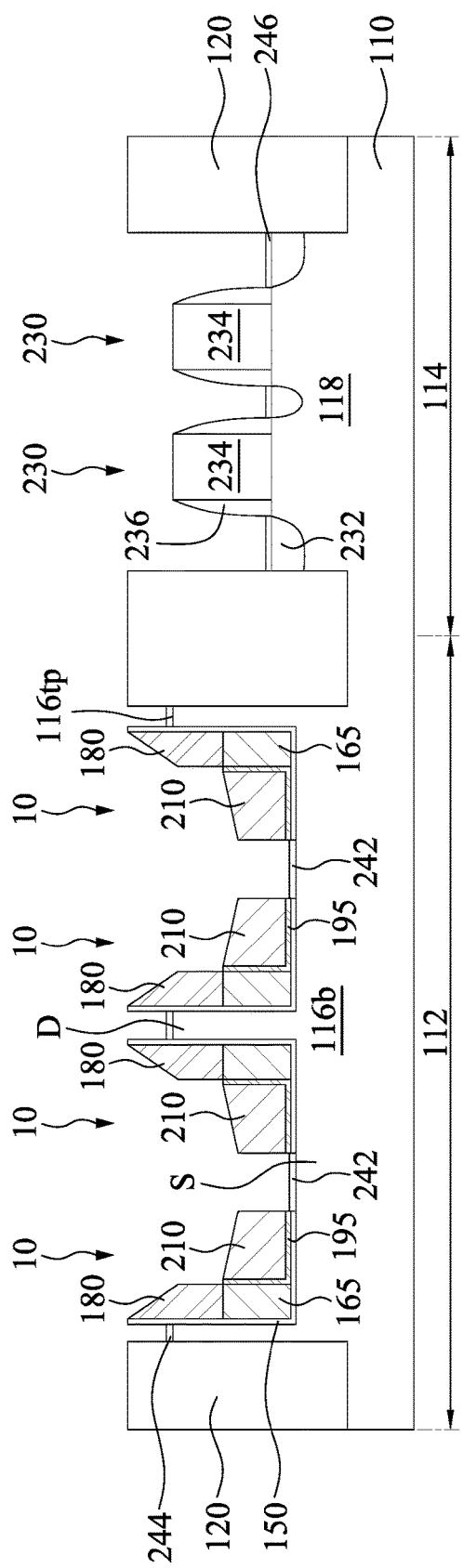
Figure 18C:
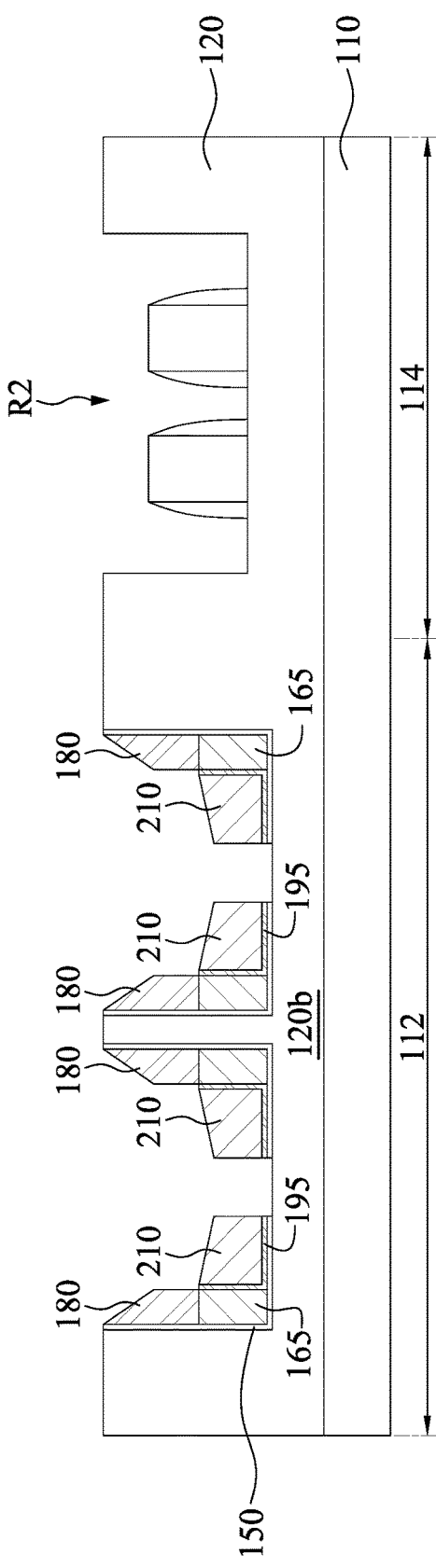

Reference is made to FIGS. 18A-18C, where FIG. 18A is a top view of the memory device according with some embodiments, FIG. 18B is a cross-sectional view taking along line B-B of FIG. 18A, and FIG. 18C is a cross-sectional view taking along line C-C of FIG. 18A. A plurality of metal alloy layers 242, 244, and 246 are respectively formed over the bottom portions 116b, the protruding portions 116p, and the source/drain regions 232. For example, a metal layer is formed over the bottom portions 116b, the protruding portions 116p, and the source/drain regions 232. An annealing process is then performed on the metal layer to form the metal alloy layers 242, 244, and 246. The annealing process is also referred to as a silicide process if the active regions 116 are made of silicon. The silicide process converts the surface portions of the active regions 116 into silicide contacts (i.e., the metal alloy layer 242, 244, and 246 in this case). Silicide processing involves deposition of a metal material that undergoes a silicidation reaction with silicon (Si). In order to form silicide contacts on the active regions 116, the metal layer is blanket deposited on the exposed surfaces of the active regions 116. After heating the wafer to a temperature at which the metal reacts with the silicon of the active regions 116 to form contacts, unreacted metal is removed. The silicide contacts remain over the active regions 116, while unreacted metal is removed from other areas. In some embodiments, the metal alloy layers 242, 244, and 246 may be made of NiSi or other suitable materials.

In FIG. 18B, a plurality of memory cells 10 are formed. Each of the memory cells 10 includes a source S, a drain D, a select gate 165, a control gate 210, and a blocking layer 195. The metal alloy layer 242 is in contact with the source S in the bottom portion 116b, the metal alloy layer 244 is in contact with the drain D in the protruding portion 116p, and the metal alloy layers 246 are in contact with the source/drain regions 232. Further, a channel is formed between the source S and the drain D. Two adjacent memory cells 10 share one drain D or one source S.

Reference is made to FIGS. 19A-19C, where FIG. 19A is a top view of the memory device according with some embodiments, FIG. 19B is a cross-sectional view taking along line B-B of FIG. 19A, and FIG. 19C is a cross-sectional view taking along line C-C of FIG. 19A. An interlayer dielectric (ILD) 250 is formed over the memory cells 10 and the semiconductor devices 230. In some embodiments, the ILD 250 is formed by chemical vapor deposition (CVD), high-density plasma CVD, spin-on, sputtering, or other suitable methods. In some embodiments, the ILD 250 includes silicon oxide. In some other embodiments, the ILD 250 may include silicon oxy-nitride, silicon nitride, or a low-k material.

Then, a plurality of contacts 262, 264, 266, 272, 274, and 276 are formed over the memory cells 10 and the semiconductor devices 230. For example, a plurality of the openings are formed in the ILD 250, and conductive materials are filled in the openings. The excess portions of the conductive materials are removed to form the contacts 262, 264, 266, 272, 274, and 276. The contacts 262, 264, 266, 272, 274, and 276 may be made of tungsten, aluminum, copper, or other suitable materials. The contacts 262 are in contact with the metal alloy layers 242, the contacts 264 are in contact with the metal alloy layers 244, the contacts 266 are in contact with the metal alloy layers 246, the contacts 272 are in contact with the control gates 210, the contacts 274 are in contact with the select gates 165, and the contacts 276 are in contact with the gate structures 234.

Figure 19E:
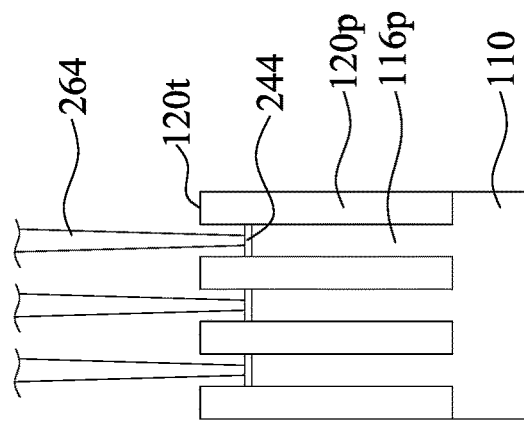
Figure 19D:
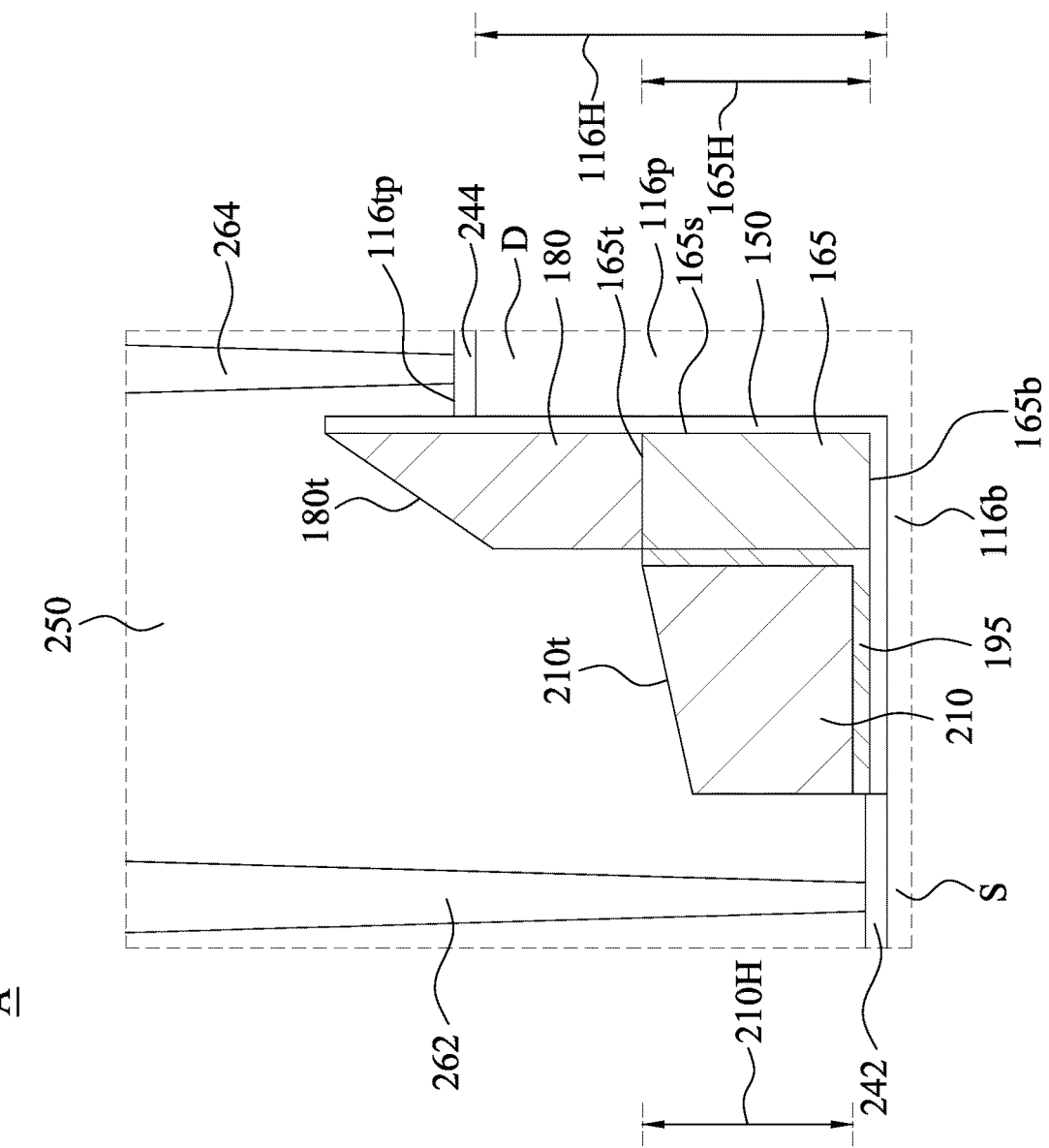

FIG. 19D is an enlarged view of an area A in FIG. 19B. Reference is made to FIGS. 19B and 19D. The drain D of the memory cell 10 is above the source S of the memory cell 10. The top surface 116tp of the drain and the top surface 234t of the gate structure 234 of the semiconductor device 230 are substantially coplanar. The gate dielectric layer 150 is in contact with the protruding portion 116p and the bottom portion 116b of the active region 116 and the ILD 250, and the gate dielectric layer 150 is L-shaped. The select gate 165 is at a position lower than the drain D of the memory cell 10 and higher than the source S of the memory cell 10. That is, the top surface 165t of the select gate 165 is lower than the top surface 116tp of the drain D (i.e., the top surface 116tp of the protruding portion 116p). A height 165H of the select gate 165 is less than a height 116H of the protruding portion 116p. The bottom surface 165b and a sidewall 165s of the select gate 165 are in contact with the gate dielectric layer 150. The spacer layer 180 is in contact with the top surface 165t of the select gate 165. The select gate 165 is surrounded by the gate dielectric layer 150, the spacer layer 180, and the blocking layer 195, such that the select gate 165 is spaced apart from the ILD 250. The blocking layer 195 is in contact with the select gate 165, the control gate 210, and the gate dielectric layer 150. The control gate 210 is above the blocking layer 195 and between the source S and the select gate 165. The control gate 210 is in contact with the ILD 250. The control gate 210 and the protruding portion 116p are on opposite sides of the select gate 165. The top surface 210t of the control gate 210 is lower than the top surface 116tp of the drain D (i.e., the top surface 116tp of the protruding portion 116p). A height 210H of the control gate 210 is less than the height 116H of the protruding portion 116p. Further, the contacts 262 and 264 have different heights, e.g., the contact 264 has a height less than that of the contact 262. The contact 262 and the protruding portion 116p are on opposite sides of the select gate 165 (the control gate 210). Moreover, the top surfaces of the contacts 262 and 264 are substantially coplanar.

FIG. 19E is a cross-sectional view taking along line E-E in FIG. 19A. Reference is made to FIGS. 19C and 19E. The topmost top surface 120t of the isolation feature 120 (i.e., the top surface 120t of the protruding portion 120p) is higher than the top surface 165t of the select gate 165 and the top surface 210t of the control gate 210. Furthermore, the topmost top surface 120t of the isolation feature 120 is higher than bottom surfaces of the contacts 262 and 264, a top surface 116tp of the drain D of the memory cell 10, and a top surface 180t of the spacer layer 180. A bottom portion of the contact 264 is surrounded by the protruding portions 120p of the isolation feature 120 and the spacer layers 180 as shown in FIGS. 19B and 19E.

Figure 20:
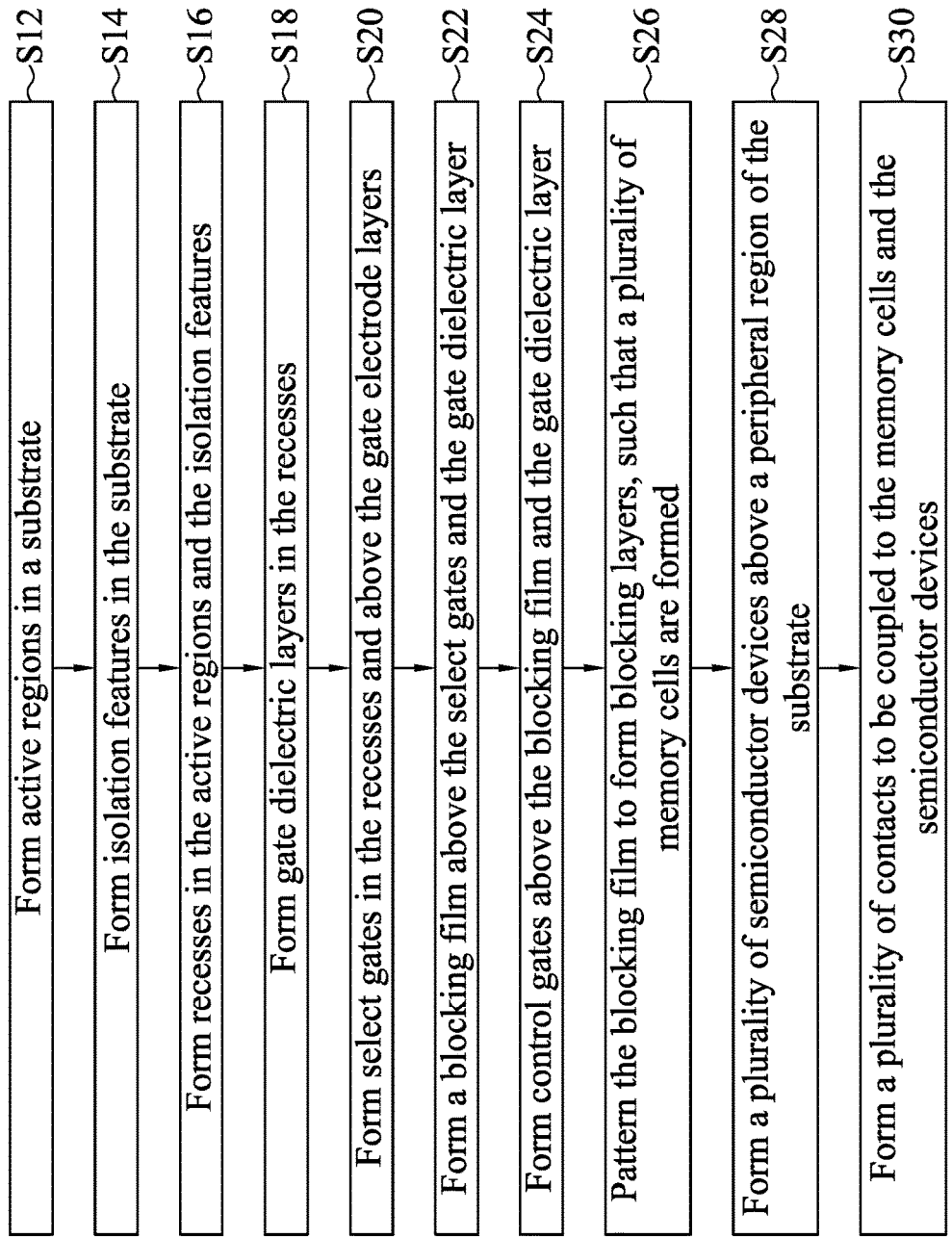
FIG. 20 is a flow chart of a method for forming a memory device in accordance with some embodiments of the present disclosure.

FIG. 20 is a flow chart of a method M1 for forming a memory device in accordance with some embodiments of the present disclosure. Although the method M1 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S12, active regions are formed in a substrate. FIGS. 1A-2C illustrate perspective views and cross-sectional views of some embodiments corresponding to act in block S12. At block S14, isolation features are formed in the substrate. FIGS. 3A-3C illustrate perspective views and cross-sectional views of some embodiments corresponding to act in block S14. At block S16, recesses are formed in the active regions and the isolation features. FIGS. 4A-5C illustrate perspective views and cross-sectional views of some embodiments corresponding to act in block S16. At block S18, gate dielectric layers are formed in the recesses. FIGS. 6A-6C illustrate perspective views and cross-sectional views of some embodiments corresponding to act in block S18. At block S20, select gates are formed in the recesses and above the gate electrode layers. FIGS. 7A-10C illustrate perspective views and cross-sectional views of some embodiments corresponding to act in block S20. At block S22, a blocking film is formed above the select gates and the gate dielectric layer. FIGS. 11A-11C illustrate perspective views and cross-sectional views of some embodiments corresponding to act in block S22. At block S24, control gates are formed above the blocking film and the gate dielectric layer. FIGS. 12A-12C illustrate perspective views and cross-sectional views of some embodiments corresponding to act in block S24. At block S26, the blocking film is patterned to form blocking layers, such that a plurality of memory cells are formed. FIGS. 13A-13C illustrate perspective views and cross-sectional views of some embodiments corresponding to act in block S26. At block S28, a plurality of semiconductor devices are formed above a peripheral region of the substrate. FIGS. 14A-16C illustrate perspective views and cross-sectional views of some embodiments corresponding to act in block S28. At block S30, a plurality of contacts are formed to be coupled to the memory cells and the semiconductor devices. FIGS. 17A-19C illustrate perspective views and cross-sectional views of some embodiments corresponding to act in block S30.

Based on the above discussions, it can be seen that the present disclosure offers advantages. It is understood, however, that other embodiments may offer additional advantages, and not all advantages are necessarily disclosed herein, and that no particular advantages are required for all embodiments. One advantage is that the pitch of a memory cell is reduced since the drain thereof is protruded from the substrate. As such, the layout area of the memory device can be dense. Another advantage is that the channel length of the memory cell remains the same compared with a planar type memory cell. Yet another advantage is that the improved memory cells do not complicate the manufacturing process for forming the memory cell.

According to some embodiments, a memory device includes an active region, a select gate, a control gate, and a blocking layer. The active region includes a bottom portion and a protruding portion protruding from the bottom portion. A source is in the bottom portion and a drain is in the protruding portion. The select gate is above the bottom portion. A top surface of the select gate is lower than a top surface of the protruding portion. The control gate is above the bottom portion. The blocking layer is between the select gate and the control gate.

According to some embodiments, a memory device includes an active region, an isolation feature, a select gate, a control gate, and a blocking layer. The isolation feature is in contact with the active region. The isolation feature includes a bottom portion and a protruding portion protruding from the bottom portion. The select gate is above the active region and the bottom portion of the isolation feature. The control gate is above the active region and the bottom portion of the isolation feature. A topmost surface of the protruding portion of the isolation feature is higher than a top surface of the control gate. The blocking layer is in contact with the select gate and the control gate.

According to some embodiments, a method for manufacturing a memory device includes forming a recess in a substrate. A select gate is formed in the recess. A blocking layer is formed in the recess and in contact with the select gate. A control gate is formed in the recess and in contact with the blocking layer. A first contact is formed in the recess and electrically connected to the substrate. A second contact is formed above the recess and electrically connected to the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   an active region having a source region and a drain region;
   a select gate over the active region and between the source region and the drain region;
   a control gate over the active region and between the source region and the select gate;
   a first metal alloy layer in contact with the source region; and
   a second metal alloy layer in contact with the drain region and higher than a top surface of the control gate.

2. The device of claim 1, wherein a top surface of the select gate is lower than the second metal alloy layer.

3. The device of claim 1, wherein a top surface of the select gate is higher than the first metal alloy layer.

4. The device of claim 1, wherein the top surface of the control gate is higher than the first metal alloy layer.

5. The device of claim 1, further comprising a blocking layer between the control gate and the select gate.

6. The device of claim 1, further comprising a spacer layer over the select gate.

7. The device of claim 6, wherein the spacer layer is spaced apart from the control gate.

8. A device comprising:
   an active region;
   an isolation feature in contact with the active region;
   a control gate and a select gate over the active region and the isolation feature; and
   a first source/drain contact and a second source/drain contact connected to the active region and on opposite sides of the control gate and the select gate, wherein a bottommost surface of the first source/drain contact is lower than a topmost surface of the isolation feature.

9. The device of claim 8, wherein the topmost surface of the isolation feature is higher than a topmost surface of the control gate.

10. The device of claim 8, wherein the topmost surface of the isolation feature is higher than a topmost surface of the select gate.

11. The device of claim 8, wherein the bottommost surface of the first source/drain contact is higher than a topmost surface of the control gate.

12. The device of claim 8, wherein the bottommost surface of the first source/drain contact is higher than a topmost surface of the select gate.

13. The device of claim 8, wherein a bottommost surface of the second source/drain contact is lower than a topmost surface of the control gate.

14. The device of claim 8, wherein a topmost surface of the first source/drain contact is substantially coplanar with a topmost surface of the second source/drain contact.

15. A device comprising:
   an isolation feature;
   an active region embedded in the isolation feature and extending in a first direction in a top view;
   a control gate and a select gate extending in a second direction and across the isolation feature and the active region in the top view, wherein the second direction is different from the first direction; and
   an oxide-nitride-oxide (ONO) structure between the control gate and the select gate, wherein a topmost surface of the ONO structure is lower than a topmost surface of the isolation feature.

16. The device of claim 15, further comprising a gate dielectric layer between the control gate and the isolation feature, wherein a topmost surface of the gate dielectric layer is higher than the topmost surface of the ONO structure.

17. The device of claim 16, wherein a portion of the gate dielectric layer is under the ONO structure.

18. The device of claim 16, wherein the topmost surface of the gate dielectric layer is higher than a topmost surface of the control gate.

19. The device of claim 16, further comprising a spacer layer over the select gate and having a topmost surface lower than the topmost surface of the gate dielectric layer.

20. The device of claim 15, wherein the topmost surface of the ONO structure is substantially coplanar with a topmost surface of the select gate.

* * * * *